(12) United States Patent
Kim et al.

(10) Patent No.: US 11,315,498 B2
(45) Date of Patent: Apr. 26, 2022

(54) DISPLAY DEVICE

(71) Applicant: Samsung Display Co., Ltd., Yongin-Si (KR)

(72) Inventors: Jun Yong Kim, Yongin-si (KR); Sung Hoon Kim, Yongin-si (KR)

(73) Assignee: Samsung Display Co., Ltd.

( * ) Notice: Subject to any disclaimer, the term of this patent is extended or adjusted under 35 U.S.C. 154(b) by 41 days.

(21) Appl. No.: 17/025,016

(22) Filed: Sep. 18, 2020

(65) Prior Publication Data

US 2021/0304679 A1 Sep. 30, 2021

(30) Foreign Application Priority Data

Mar. 27, 2020 (KR) .................. 10-2020-0037784

(51) Int. Cl.
| | | |
|---|---|---|
| *G06F 3/038* | (2013.01) | |
| *G09G 5/00* | (2006.01) | |
| *G09G 3/3266* | (2016.01) | |
| *G09G 3/3233* | (2016.01) | |
| *H02J 7/02* | (2016.01) | |
| *H02J 50/10* | (2016.01) | |
| *H02J 50/70* | (2016.01) | |

(Continued)

(52) U.S. Cl.
CPC ......... *G09G 3/3266* (2013.01); *G09G 3/3233* (2013.01); *H01L 25/18* (2013.01); *H01L 51/5237* (2013.01); *H02J 7/02* (2013.01); *H02J 50/10* (2016.02); *H02J 50/70* (2016.02); *H05K 9/0054* (2013.01); *G09G 2300/0809* (2013.01); *G09G 2320/02* (2013.01); *G09G 2330/04* (2013.01); *G09G 2330/06* (2013.01); *G09G 2340/0464* (2013.01)

(58) Field of Classification Search
CPC ....... G09G 2300/0809; G09G 2320/02; G09G 2330/04; G09G 2330/06; G09G 2340/0464; G09G 3/3233; G09G 3/3266; H01L 25/18; H01L 51/5237; H02J 2310/22; H02J 50/005; H02J 50/10; H02J 50/402; H02J 50/70; H02J 7/0042; H02J 7/02; H05K 9/0054
See application file for complete search history.

(56) References Cited

U.S. PATENT DOCUMENTS 7,994,714 B2   8/2011   Cok et al.
9,979,241 B2   5/2018   Park
(Continued)

FOREIGN PATENT DOCUMENTS

KR   10-1202308 B1   11/2012
KR   10-1706628 B1   2/2017
(Continued)

*Primary Examiner* — Insa Sadio
(74) *Attorney, Agent, or Firm* — Innovation Counsel LLP

(57) ABSTRACT

A display device comprises: a display screen comprising a display surface that includes a display area and a non-display area; a charger disposed under the bottom surface of the display screen, the charger performing charging by using a magnetic field; and a panel protector disposed between the display screen and the charger, the panel protector comprising a magnetic field transmission part that overlaps with the display area in a plan view. When charging is performed through a charging area of the display area, an image is not displayed in the charging area.

20 Claims, 22 Drawing Sheets

(51) Int. Cl.
   *H05K 9/00*      (2006.01)
   *H01L 25/18*     (2006.01)
   *H01L 51/52*     (2006.01)

(56) References Cited

U.S. PATENT DOCUMENTS

| | | |
|---|---|---|
| 10,141,625 B1 | 11/2018 | Ryu et al. |
| 10,404,089 B2 | 9/2019 | Kasar et al. |
| 10,505,386 B2 | 12/2019 | Kasar et al. |
| 2011/0050164 A1* | 3/2011 | Partovi ............... H02J 7/00304 320/108 |
| 2015/0311740 A1* | 10/2015 | Hilario .................... H01F 38/14 320/108 |
| 2018/0350505 A1 | 12/2018 | Ryu et al. |

FOREIGN PATENT DOCUMENTS

| | | |
|---|---|---|
| KR | 20-2017-0001258 U | 4/2017 |
| KR | 10-2018-0133153 A | 12/2018 |
| KR | 10-2019-0008067 A | 1/2019 |
| KR | 10-2019-0024178 A | 3/2019 |

* cited by examiner

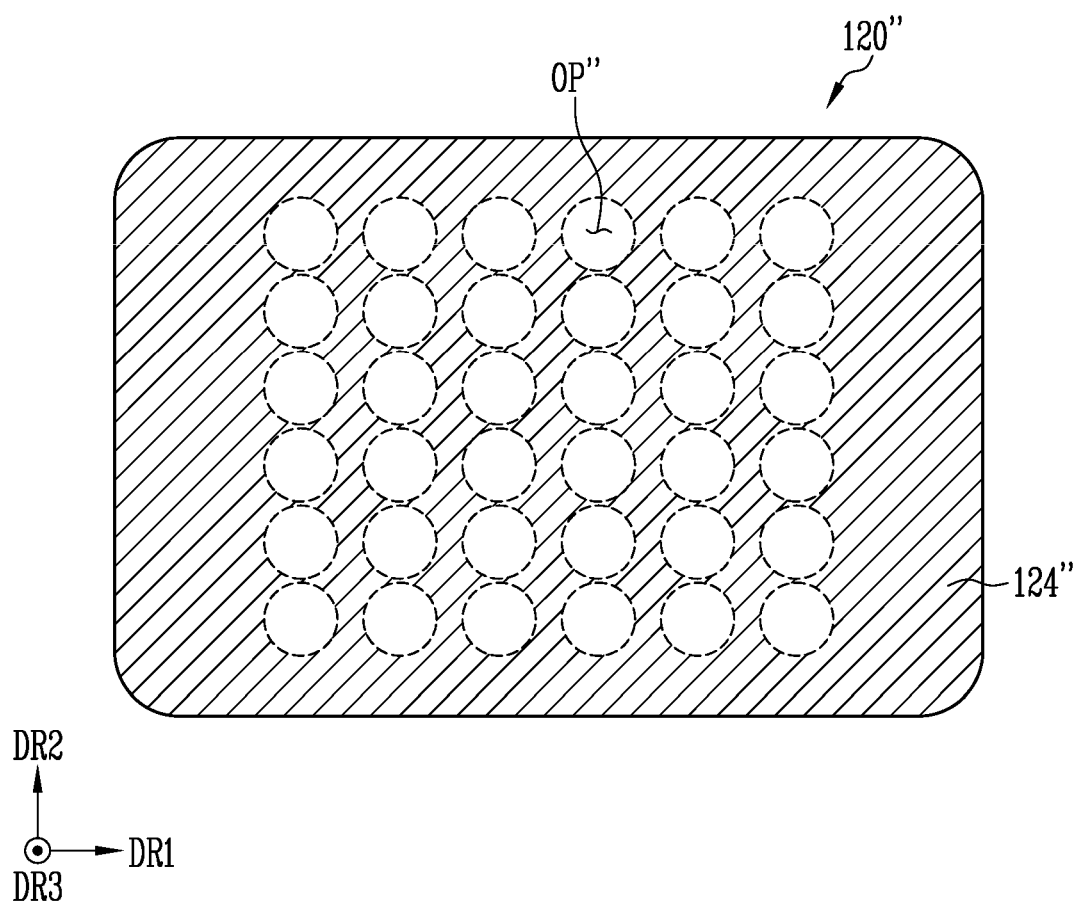

SDR: SCAN DRIVER
EDR: EMISSION CONTROL DRIVER

FIG. 17
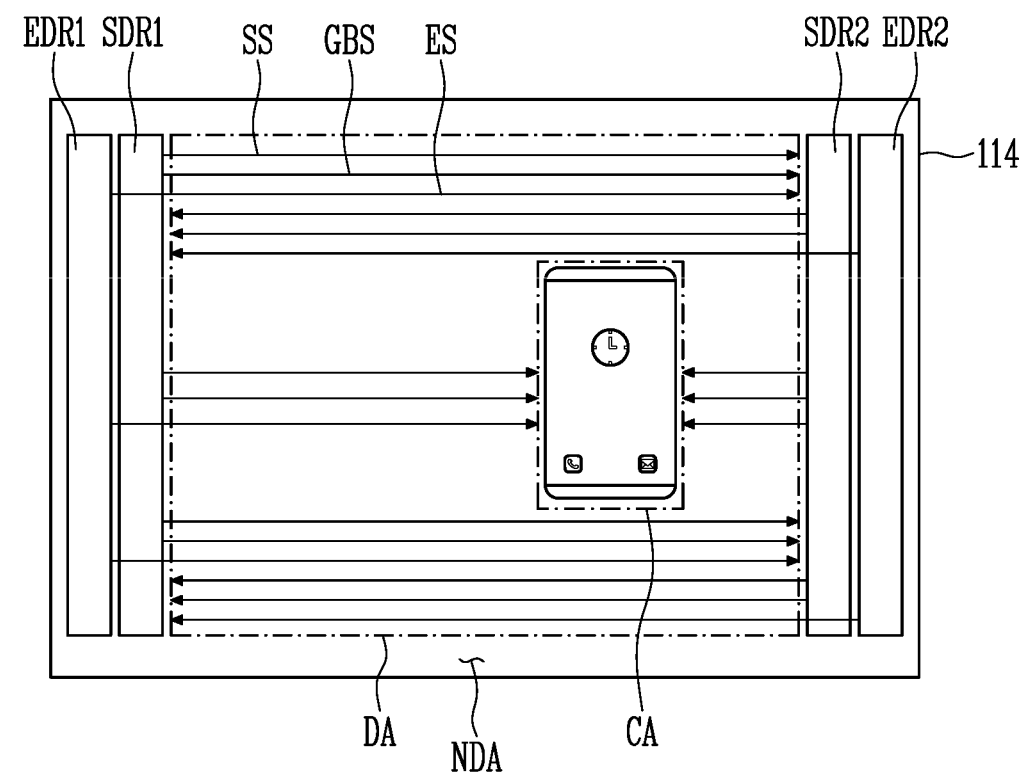
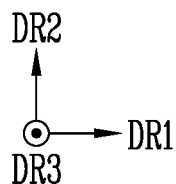
SDR1: FIRST SCAN DRIVER
SDR2: SECOND SCAN DRIVER
EDR1: FIRST EMISSION CONTROL DRIVER
EDR2: SECOND EMISSION CONTROL DRIVER

DISPLAY DEVICE

CROSS-REFERENCE TO RELATED APPLICATION

This application claims priority under 35 U.S.C. § 119 to Korean Patent Application No. 10-2020-0037784, filed on Mar. 27, 2020, the disclosure of which is incorporated by reference herein in its entirety.

1. Technical Field

The present disclosure generally relates to a display device.

2. Discussion of the Related Art

In recent years, with the development of digital technology, various portable terminals such as a mobile communication terminal, a notebook computer, an electronic note, a smart phone, and a tablet Personal Computer (PC) capable of processing communication and personal information while a user is moving have been introduced.

Such a portable terminal generally uses a battery for the purpose of portability. The battery of the portable terminal is necessary for charging, and a wired charging method is generalized as a charging method of the battery. A wireless charging system based on a non-contact charging method using inductive coupling has recently been developed.

The wireless charging system uses a method in which a battery is charged by using an induced current generated in a secondary coil comprised in a portable terminal due to a magnetic field generated in a primary coil comprised in a charging pad to which power is applied.

Meanwhile, the portable terminal comprises a display device to provide an image to a user. The display device is a device for displaying an image, and comprises an organic light emitting display panel comprising organic light emitting diodes (OLEDs) elements or quantum dot electroluminescence (QD-EL) elements, or a display panel such as a liquid crystal display panel.

In a wireless charging method, Electro-Magnetic Interference (EMI) may occur in a magnetic field exchange process of coils comprised in a charging pad and a portable terminal. The portable terminal may comprise a shielding sheet on the bottom of a display panel to protect a circuit of the display panel, a driving signal of the display panel, and the like from the EMI.

Research for attempting to perform wireless charging through a front surface of a display panel has recently been conducted. However, since the front surface of the display panel comprises a display area in which an image is displayed, a driving signal of the display panel may be fluctuated, when noise is generated around a coil. Therefore, a stripe pattern may occur on a screen, or image quality distortion may occur.

SUMMARY

Embodiments provide a display device in which a magnetic field exchange process between a primary coil and a secondary coil can be smoothly performed without being interfered by a shielding sheet in wireless charging.

Embodiments also provide a display device capable of protecting a circuit of a display panel, a driving signal of the display panel, and the like from Electro-Magnetic Interference (EMI) which may be generated in a magnetic field exchange process between a primary coil and a secondary coil.

In accordance with an aspect of the present disclosure, there is provided a display device comprising: a display screen comprising a display surface that includes a display area and a non-display area; a charger disposed under the bottom surface of the display screen, the charger performing charging by using a magnetic field; and a panel protector disposed between the display screen and the charger, the panel protector comprising a magnetic field transmission part that overlaps with the display area in a plan view.

The display screen may include a switch circuit which interrupts a signal applied to a charging area in the display area such that an image is not displayed in the charging area when charging is performed through the charging area.

The display screen may comprise: a first scan driver disposed on located at one side of the non-display area, the first scan driver supplying scan signals to a plurality of scan lines and supplying initialization control signals to a plurality of initialization control lines, and a first emission control driver disposed on the one side of the non-display area, the first emission control driver supplying emission control signals to a plurality of emission control lines.

The charging area may comprise a first charging area disposed on the display area adjacent to the other side of the non-display area that opposes the one sided of the non-display area.

The switch circuit may comprise a first switch circuit disposed adjacent to the one side of the non-display area.

The first switch circuit may comprise a plurality of signal control transistors for controlling transmission of at least one of the scan signals and the emission control signals to a plurality of scan lines connected to the first switch circuit.

The display screen may further comprise a second scan driver and a second emission control driver disposed on the other side of the non-display area.

The charging area may comprise a second charging area disposed on the display area adjacent to the one side of the non-display area.

The second scan driver and the second emission control driver may be turned off when charging is performed through the first charging area, and the first scan driver and the first emission control driver may be turned off when charging is performed through the second charging area.

When charging is performed through the second charging area, the display screen may display an image in a second charging mode display area which does not comprise the second charging area in the display area. The switch circuit may further comprise a second switch circuit disposed adjacent to the other side of the non-display area.

Each of the first switch circuit and the second switch circuit may comprise a plurality of signal control transistors for controlling transmission of at least one signal among the scan signals and the emission control signals to a plurality of scan lines connected to the first switch circuit and the second switch circuit.

The display screen may further comprise a plurality of pixels disposed in the display area.

Each of the pixels comprises a driving transistor, at least one emission control transistor, and at least one switch transistor.

Each of the signal control transistors may be disposed between a first pixel and a second pixel which are disposed adjacent to each other among the plurality of pixels, and be connected to a scan line for supplying a gate signal to each switch transistor of the first pixel and the second pixel.

Each of the signal control transistors may be disposed between a first pixel and a second pixel which are disposed adjacent to each other among the plurality of pixels, and be connected to an emission control line for supplying a gate signal to at least one emission control transistor of each of the first pixel and the second pixel.

The panel protector may comprise a shielding layer disposed in an area overlapping with the non-display area in a plan view.

The shielding layer may comprise at least one of copper, nickel, ferrite, and silver which shields an electromagnetic wave.

The panel protector may further comprise: a light absorbing layer disposed under the display screen, the light absorbing layer blocking light emitted from the display screen from being leaked through the bottom of the display screen; a shock absorbing layer disposed under the light absorbing layer, the shock absorbing layer absorbing external impact; and a heat dissipation layer disposed under the shock absorbing layer, the heat dissipation layer dissipating heat generated from the display screen.

The shielding layer may be disposed under the heat dissipation layer.

The charger may comprise at least one coil pattern overlapping with the magnetic field transmission part. The charger may supply power to an external device such as another display device through the display surface, or be supplied with power from a wireless power transmitter to charge a battery.

The charger may comprise the coil pattern in an area overlapping with the charging area in a plan view.

The panel protector may comprise the shielding layer in an area which does not overlap with the charging area in a plan view.

The shielding layer may comprise a plurality of openings having a circular shape.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 5A, 5B and 5C are plan views illustrating various embodiments of a panel protector shown in FIG. 3.

FIG. 17 is a view illustrating a driving method of a display panel in accordance with another embodiment of the present disclosure.

DETAILED DESCRIPTION OF THE EXEMPLARY EMBODIMENTS

Figure 1:
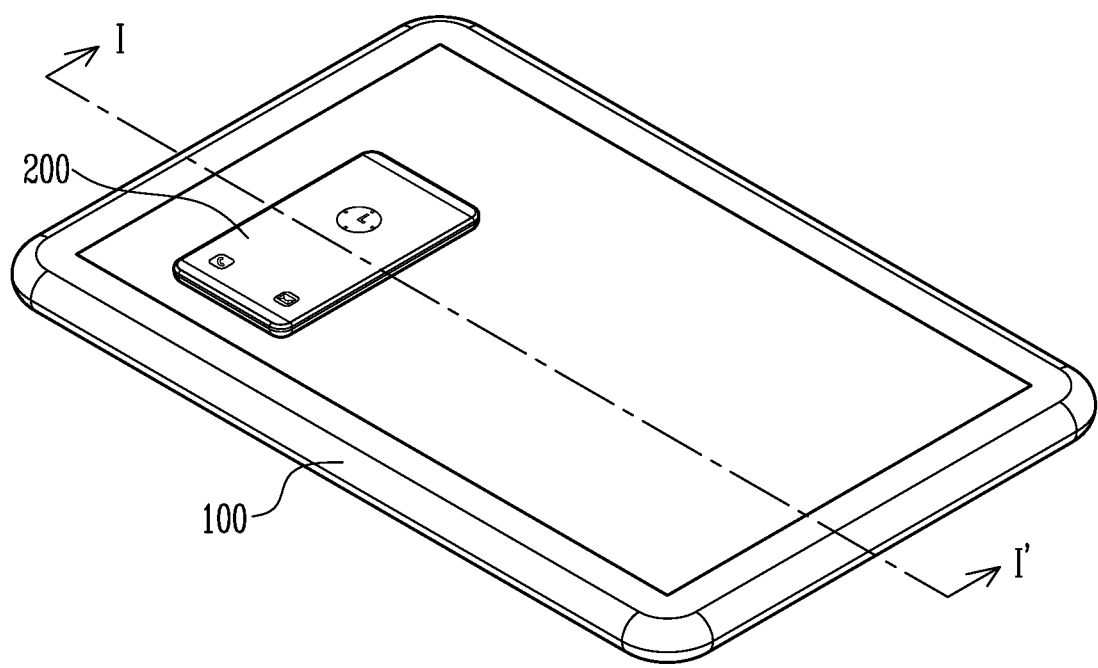
FIGS. 1 and 2 are perspective views illustrating display devices for wireless charging.

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

Like numbers refer to like elements throughout, and duplicative descriptions thereof may not be provided. The thicknesses, ratios, and dimensions of elements may be exaggerated in the drawings for clarity. As used herein, the term "and/or" comprises any and all combinations of one or more of the associated listed items.

It will be understood that, although the terms "first," "second," etc. may be used herein to describe one or more elements, these terms should not be construed as limiting such elements. These terms are only used to distinguish one element from another element. Thus, a first element could be alternately termed a second element without departing from the spirit and scope of the present disclosure. Similarly, a second element could be alternately termed a first element. Singular forms of terms are intended to comprise the plural forms as well, unless the context clearly indicates otherwise.

Moreover, spatially relative terms, such as "beneath," "below," "lower," "above," "upper," and the like may be used herein for ease of description to describe one element's spatial relationship to another element(s) as illustrated in the drawings. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be further understood that the terms "comprises" and "comprising," when used in this disclosure, specify the presence of stated features, integers, acts, operations, elements, and/or components, but do not preclude the presence or addition of one or more other features, integers, steps, operations, elements, components, and/or groups thereof.

In the entire specification, when an element is referred to as being "connected" or "coupled" to another element, it can be directly connected or coupled to the another element or be indirectly connected or coupled to the another element with one or more intervening elements interposed therebetween. Further, some of the elements that are not essential to the complete understanding of the disclosure are omitted for clarity. Also, like reference numerals refer to like elements throughout.

Figure 2:
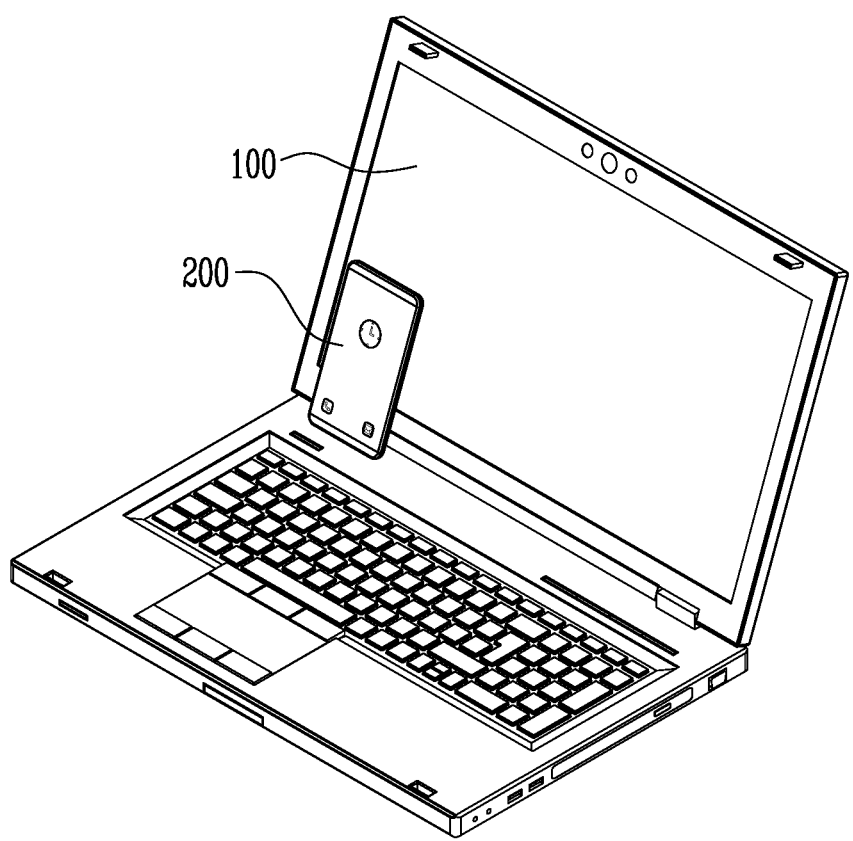

FIGS. 1 and 2 are perspective views illustrating display devices for wireless charging.

Referring to FIGS. 1 and 2, a case where a first display device 100 and a second display device 200 are used for a wireless charging operation of the present disclosure will be described. Hereinafter, in the embodiment of the present disclosure, the first display device 100 will be described as a main agent which performs a main operation of the present disclosure.

The first display 100 may function to supply energy for charging the second display device 200 when the second display device 200 is in contact with (or approaches to) the first display device 100. That is, in the present disclosure, the first display device 100 may serve as a source device which supplies energy (a transmitter). For example, the first display device 100 may be a tablet PC, a notebook computer, or the like. In accordance with an embodiment of the present disclosure, the first display device 100 may supply energy to the second display device 200 through a front surface of the first display device 100 (or a display surface IS, see FIG. 3).

Like the first display device 100, the second display device 200 may serve as a source device which supplies energy (power) by wireless to charge another display device which is in contact with (or approaches to) the second display device 200, or serve as a target device (a receiver) which is charged by being supplied with energy for charging from another display device. For example, the second display device 200 may be an electronic note, a smart phone, or the like. In accordance with an embodiment of the present disclosure, the second display device 200 may be a receiver which receives energy from the first display device 100 through a rear surface of the second display device 200.

However, the charging method of the first display device 100 and the second display device 200 is not limited thereto. For example, the first display device 100 may supply energy to the second display device 200 through a rear surface of the display panel, and the second display device 200 may receive energy from the first display device 100 through any one of a front surface and the rear surface of the second display device 200.

Figure 3:
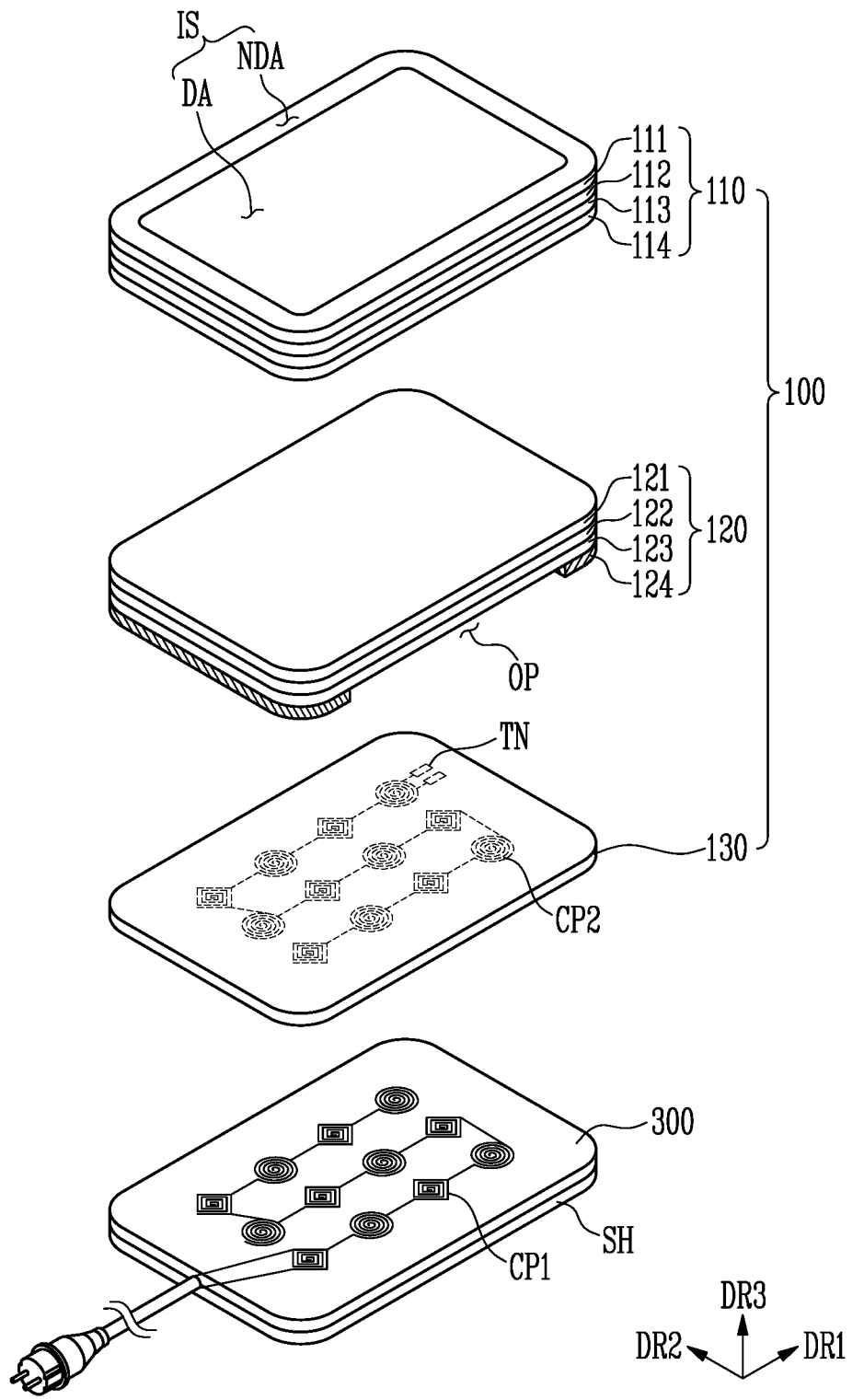
FIG. 3 is an exploded perspective view of a display device comprising a wireless power transmitter.

FIG. 3 is an exploded perspective view of a display device comprising a wireless power transmitter. The display device may be the first display device 100 shown in FIGS. 1 and 2.

Referring to FIG. 3, the first display device 100 may comprise a display screen 110, a panel protector 120, and a charger 130.

The display screen 110 may comprise a window 111, an optical sheet 112, a touch sensor 113, and a display panel 114. The display panel 114, touch sensor 113, the optical sheet 112, and the window 111 may be sequentially stacked. Although not shown in the drawing, the window 111, the optical sheet 112, the touch sensor 113, and the display panel 114 may be coupled to each other by an adhesive member. The adhesive member may be an organic adhesive layer such as an Optically Clear Adhesive film (OCA), an Optically Clear Resin (OCR), or a Pressure Sensitive Adhesive film (PSA). The organic adhesive layer may comprise an adhesive material such as a polyurethane-based, polyacryl-based, polyester-based, epoxy-based, or polyvinyl acetate-based adhesive material.

The window 111 may protect the display panel 114 from external impact and provide an input surface to a user. The window 114 may be a display surface IS exposed to the outside.

The window 111 may comprise a plastic film. The window may have a multi-layered structure. The window 111 may have a multi-layered structure selected from a glass substrate, a plastic film, and a plastic substrate. The window 111 may further comprise a bezel pattern. The multi-layered structure may be formed through an adhesive process using a continuous process or an adhesive layer.

The optical sheet 112 reduces reflexibility of external light. The optical sheet 112 may at least comprise a polarizing film. The optical sheet 112 may further comprise a phase shift film. In an embodiment of the present disclosure, the optical sheet 112 may be omitted.

The touch sensor 113 acquires coordinate information of an external input. The touch sensor 113 may sense an external input by using a capacitive method. The touch sensor 113 may be disposed on the display panel 114. Also, in an embodiment, the touch sensor 113 may be directly disposed on the display panel 114. In this specification, the term "directly disposed" excludes attachment using a separate adhesive layer, and means formation through a continuous process.

The display panel 114 may be defined as a panel which displays an image. To this end, the display panel 114 may comprise a plurality of display elements. In an embodiment, the plurality of display elements may be a plurality of organic light emitting elements.

The display panel 114 may comprise the display surface IS. The display surface IS on which an image is displayed is parallel to a surface defined by a first direction DR1 and a second direction DR2. A normal direction of the display surface IS, i.e., a thickness direction of the display panel 114 is indicated by a third direction DR3. A front surface (or top surface) and a rear surface (or bottom surface) of each component are distinguished by the third direction DR3. However, directions indicated by the first to third directions DR1, DR2, and DR3 are relative concepts, and may be changed into other directions. Hereinafter, first to third directions are directions respectively indicated by the first to third directions DR1, DR2, and DR3, and are designated by like reference numerals.

The display surface IS of the display panel 114 may comprise a plurality of areas. The display panel 114 comprises a display area DA in which an image is displayed and a non-display area NDA disposed adjacent to the display area DA. The non-display area NDA is an area in which the image is not displayed. For example, the display area DA may have a quadrangular shape. The non-display area NDA may surround the display area DA. However, the present disclosure is not limited thereto, and the shape of the display area DA and the shape of the non-display area NDA may be relatively designed.

Although not separately shown in the drawing, the display screen 110 in accordance with the embodiment of the present disclosure may further comprise an anti-reflective layer. The anti-reflective layer may comprise a stacked structure of color filter or conductive layer/insulating layer/conductive layer. The anti-reflective layer may reduce reflexibility of external light by absorbing, destructively interfering with, or polarizing light incident from the outside. The anti-reflective layer may replace a function of the optical sheet 112.

The panel protector 120 may be disposed on one surface of the display panel 114. For example, the panel protector 120 may be disposed on a lower surface of the display panel 114.

In accordance with an embodiment of the present disclosure, the panel protector 120 may comprise at least one of a light absorbing layer 121 capable of blocking light emitted from the display panel 114 from being leaked through the bottom of the display panel 114, a shock absorbing layer 122 capable of absorbing external impact, a heat dissipation layer 123 capable of dissipating heat generated from the display panel 114, and a shielding layer 124 capable of shielding Electro-Magnetic Interference (EMI) which may be generated from the charger 130 which will be described later.

The light absorbing layer 121 may be disposed on the bottom of the display panel 114. The light absorbing layer 121 blocks transmission of light, to prevent components, e.g., a display circuit board (not shown) and the like, which are disposed on the bottom of the light absorbing layer 121, from being viewed from the top of the display panel 114. The light absorbing layer 121 may comprise a light absorbing material such as a black pigment or a dye.

The shock absorbing layer 122 may be disposed on the bottom of the light absorbing layer 121. The shock absorbing layer 122 absorbs external impact to prevent the display panel 114 from being damaged. The shock absorbing layer 122 may be provided in a single layer or a multi-layer. For example, the shock absorbing layer 122 may be formed of a polymer resin such as polyurethane, polycarbonate, polypropylene or polyethylene, or comprise a sponge formed by foaming rubber, a urethane material or an acrylic material. The shock absorbing layer 122 may be a cushion layer.

The heat dissipation layer 123 may be disposed on the bottom of the shock absorbing layer 122. The heat dissipation layer 123 may be formed of graphite, carbon nanotubes, or the like.

The shielding layer 124 may be disposed on the bottom of the heat dissipation layer 123. The shielding layer 124 may be formed of a metal thin film such as copper, nickel, ferrite or silver, which shields EMI and has excellent heat conductivity.

In accordance with an embodiment of the present disclosure, the panel protector 120 may comprise a magnetic field transmission part OP so as to perform wireless charging through a front surface (or the display surface IS). The magnetic field transmission part OP will be described in detail later with reference to FIGS. 5A to 5C.

The charger 130 may be disposed on one surface of the panel protector 120. In accordance with an embodiment of the present disclosure, the charger 130 may be disposed on a lower surface of the panel protector 120.

The charger 130 may be charged by wireless through a wireless power transmitter 300. In order to perform wireless charging, the wireless power transmitter 300 may comprise a plurality of primary coil patterns CP1 on one surface thereof, and the charger 130 may comprise a plurality of secondary coil patterns CP2.

For example, when a predetermined electrical signal is applied to the primary coil pattern CP1 formed in the wireless power transmitter 300, a magnetic field may be generated. The magnetic field of the primary coil pattern CP1 may be emitted to the outside, and an induced magnetic field may be generated in the secondary coil pattern CP2 disposed adjacent to the primary coil pattern CP1. The plurality of secondary coil patterns CP2 may be connected to a battery (not shown) through a terminal TN. The battery may be electrically connected to the charger 130 through the terminal TN. The first display device 100 may charge power generated from the secondary coil pattern CP2 in the battery through a rectifier circuit.

In FIG. 3, the primary and secondary coil patterns CP1 and CP2 are illustrated as a plurality of patterns having a circular shape or a diamond shape, but the shape and number of the patterns may be variously changed. For example, the pattern may have a single spiral shape.

The wireless power transmitter 300 wirelessly transmits power to the charger 130 by using a magnetic field generated in the primary coil pattern CP1, and the magnetic field generated in the primary coil pattern CP1 is to be transferred to the charger 130 along an upper direction. Therefore, the wireless power transmitter 300 may comprise a magnetic field shielding sheet SH so as not to interfere with a wireless power transmission function. The magnetic field shielding sheet SH may be disposed on a surface opposite to that on which the primary coil pattern CP1 is formed.

Figure 4:
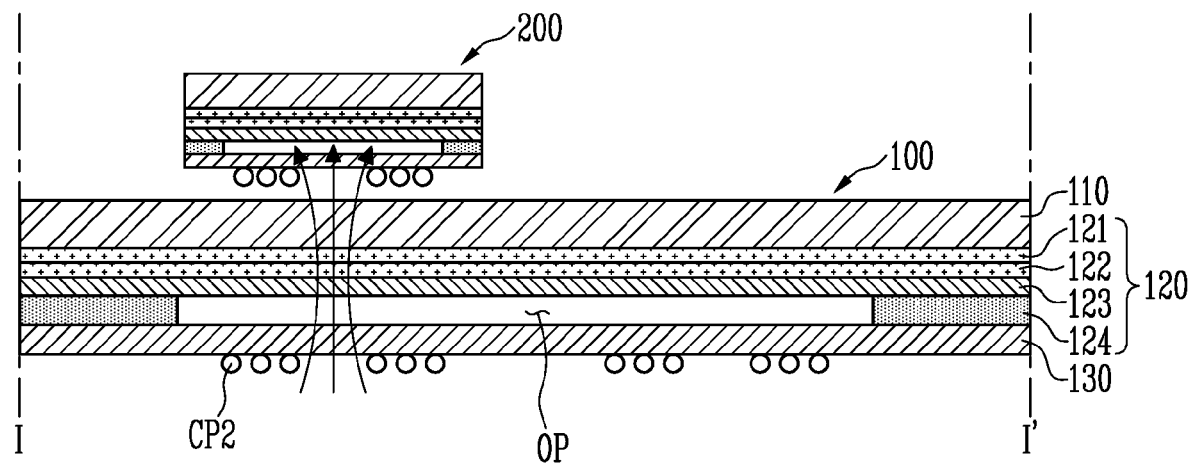
FIG. 4 is a sectional view taken along line I-I' shown in FIG. 1.
Figure 5A:
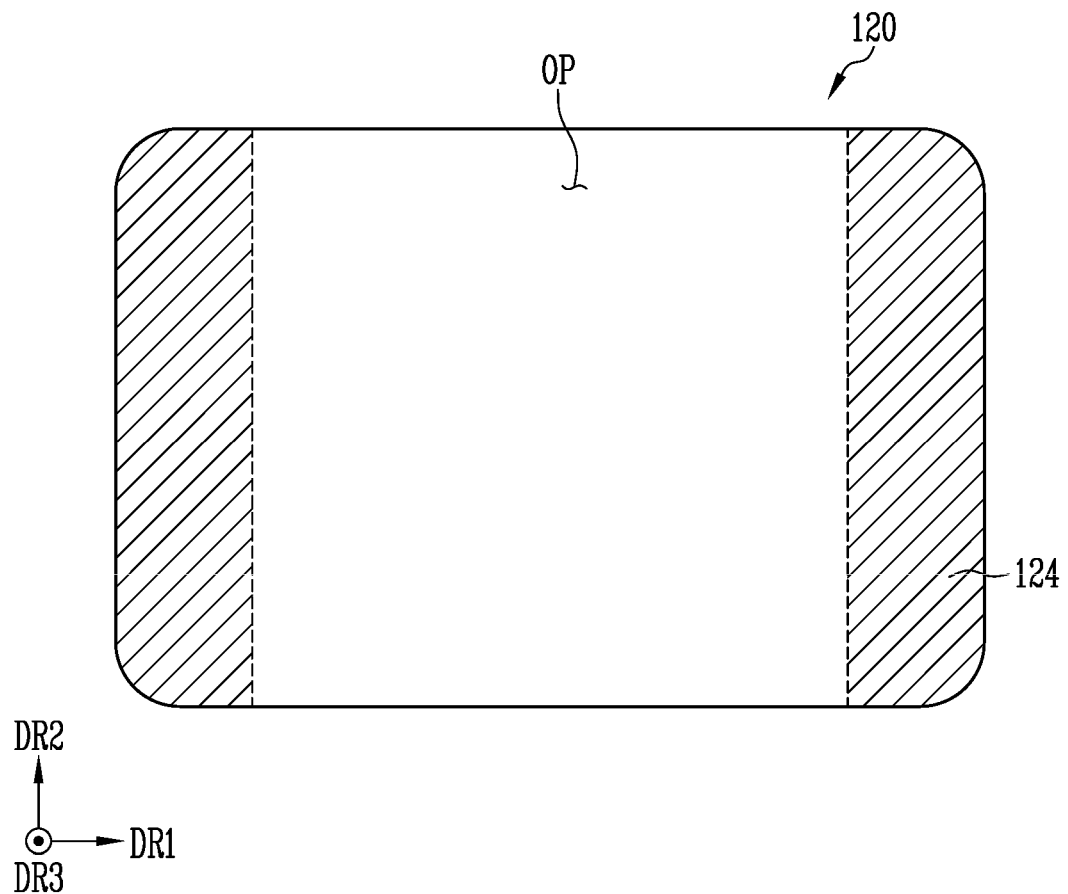
Figure 5B:
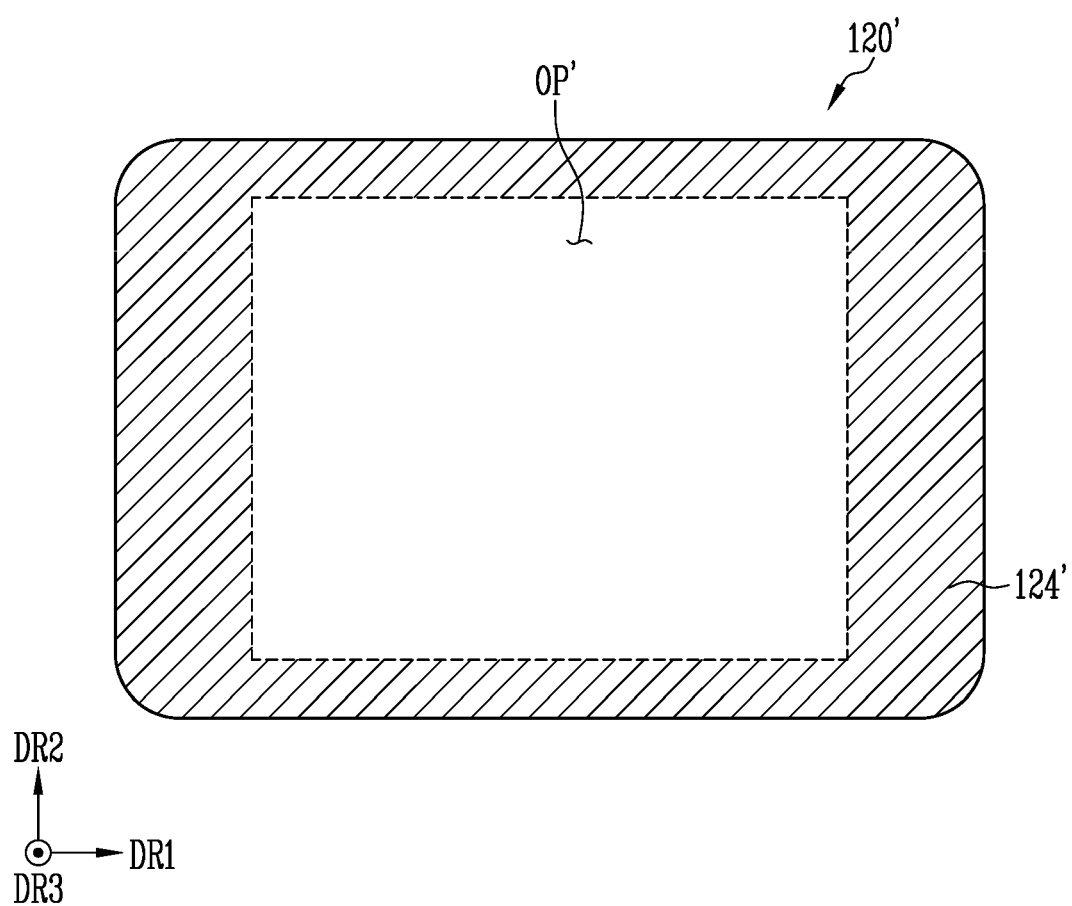

FIG. 4 is a sectional view taken along line I-I' shown in FIG. 1. FIGS. 5A to 5C are plan views illustrating various embodiments of the panel protector shown in FIG. 3.

Referring to FIGS. 3, 4, and 5A to 5C, the panel protector 120 of the first display device 100 may comprise the magnetic field transmission part OP so as to perform reverse wireless charging with the second display device 200 through the front surface (or the display surface IS).

The first display device 100 may serve as a source device (the transmitter) which supplies charged energy to another display device while enabling wireless charging to be performed through the wireless power transmitter 300. In accordance with an embodiment of the present disclosure, the display device 100 may supply energy to the second display device 200 through the front surface (or the display surface IS) of the display panel 114. The second display device 200 has a configuration substantially identical to that of the first display device 100, which is described above, and therefore, overlapping descriptions will be omitted.

When the shielding layer 124 of the first display device 100 is disposed to overlap with the entire area of the display screen 110 in a plan view, a magnetic field generated from the secondary coil pattern CP2 disposed in the charger 130 may not advance toward the front surface (or the display surface IS) of the display panel 114. That is, it required to remove the shielding layer 124 such that wireless charging is performed through the front surface (or the display surface IS) of the display panel 114.

However, the display panel 114 of the first display device 100 may comprise Integrated Circuit (IC) elements such as a scan driver, an emission control driver, a timing controller, and the like. In wireless charging between the first display device 100 and the second display device 200, the IC elements and/or a driving signal may be influenced by noise caused by EMI. Therefore, a stripe pattern may occur on a screen and image quality distortion may occur. That is, arrangement of the shielding layer 124 is required so as to protect the IC elements comprised in the display panel 114 of the first display device 100 from the noise caused by EMI.

Accordingly, the shielding layer 12 requires the magnetic field transmission part OP which enables a magnetic field generated from the secondary coil pattern CP2 to selectively pass therethrough toward the front surface (or the display surface IS) of the display panel 114.

The shielding layer 124 may be disposed on a lower surface of the heat dissipation layer 123. The magnetic field transmission part OP may be defined as an area in which the shielding layer 124 is not disposed. The magnetic field transmission part OP may be formed in an area overlapping with the secondary coil pattern CP2 disposed in the charger 130 in the thickness direction (or the third direction DR3). In other words, the shielding layer 124 may be formed in an area which does not overlap with the secondary coil pattern CP2 disposed in the charger 130 in the thickness direction (or the third direction DR3).

The IC elements such as the scan driver, the emission control driver, and the timing controller may be disposed in one area of the display panel 114, which overlap with the shielding layer 124 in the thickness direction (or the third direction DR3).

As shown in FIG. 5A, in accordance with an embodiment of the present disclosure, the panel protector 120 may have the same shape as the display panel 114, for example, a quadrangular shape, and each corner of the panel protector 120 may be rounded to correspond to the shape of the display panel 114. The shielding layer 124 may be disposed such that portions of the shielding layer 124 are spaced apart from each other in the first direction DR1 to form the magnetic field transmission part OP having a quadrangular shape.

However, the shape, size, and number of magnetic field transmission parts OP are not limited to the above-described embodiment.

For example, as shown in FIG. 5B, a panel protector 120' may have a quadrangular shape, and each corner of the panel protector 120' may be rounded to correspond to the shape of the display panel 114. A shielding layer 124' may be disposed to surround a magnetic field transmission part OP' having a quadrangular shape.

In addition, as shown in FIG. 5C, a panel protector 120" may have a quadrangular shape, and each corner of the panel protector 120" may be rounded to correspond to the shape of the display panel 114. A shielding layer 124" may be disposed to surround a plurality of magnetic field transmission parts OP" having a circular shape.

Meanwhile, when an image is displayed on the display surface IS of the display panel 114, i.e., when wireless charging is performed with the second display device 200 through the front surface (or the display surface IS) of the first display device 100 while a driving signal is being supplied from the IC elements, noise may be generated at the periphery of the charger 130 due to EMI. Accordingly, there is required a method for displaying an image on the display surface IS of the display panel 114 without being interrupted by the noise. This will be described in detail with reference to FIGS. 6 to 10.

Figure 6:
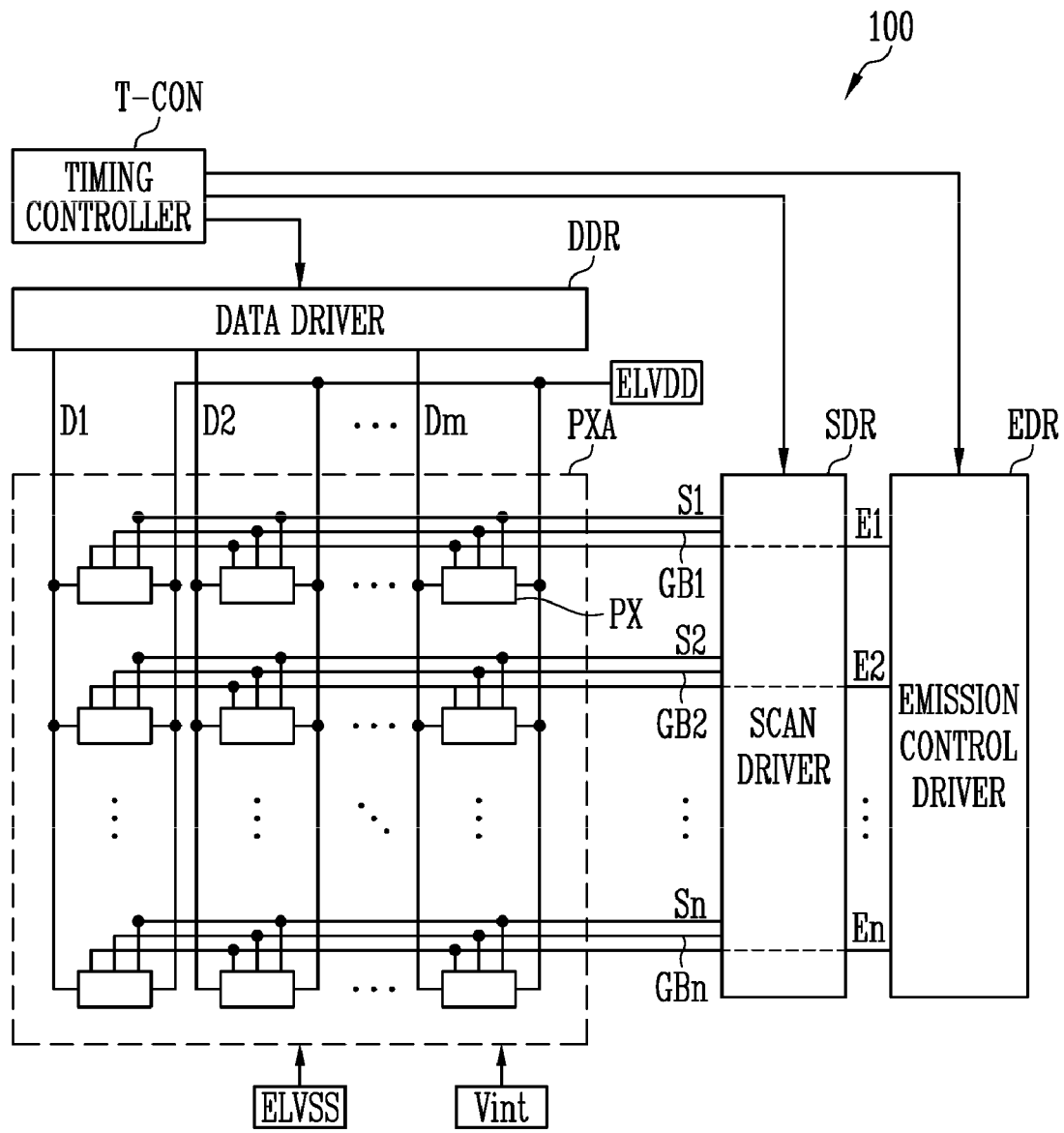
FIG. 6 is a diagram illustrating a display device comprising a plurality of drivers, a timing controller, and pixels.

FIG. 6 is a diagram illustrating a display device comprising a plurality of drivers, a timing controller, and pixels.

Referring to FIG. 6, the first display device 100 in accordance with the embodiment of the present disclosure may comprise a pixel area PXA comprising pixels PX disposed in areas defined by scan lines S1 to Sn and data lines D1 to Dm, a scan driver SDR for driving the scan lines S1 to Sn and initialization control lines GB1 to GBn, a data driver DDR for driving the data lines D1 to Dm, an emission control driver EDR for driving emission control lines E1 to En, and a timing controller T-CON for controlling the scan driver SDR, the data driver DDR, and the emission control driver EDR.

The scan driver SDR may supply a scan signal to the scan lines S1 to Sn under the control of the timing controller T-CON. In an example, the scan driver SDR may sequentially supply the scan signal to the scan lines S1 to Sn. Also, the scan driver SDR may sequentially supply an initialization control signal to the initialization control lines GB1 to GBn under the control of the timing controller T-CON. Additionally, the initialization control signal GB1 to GBn may be set to a gate-on voltage such that transistors comprised in the pixels PX can be turned on.

The emission control driver EDR may supply an emission control signal to the emission control lines E1 to En under the control of the timing controller T-CON. In an example, the emission control driver EDR may sequentially supply the emission control signal to the emission control lines E1 to En.

The emission control signal may be set to have a width wider than that of the scan signal. In an example, the emission control signal may be supplied to overlap with at least two scan signals. Additionally, the emission control signal may be set to a gate-off voltage (e.g., a high voltage) such that the transistors comprised in the pixels PX can be turned off, and the scan signal may be set to a gate-on voltage (e.g., a low voltage) such that the transistors comprised in the pixels PX can be turned on.

The data driver DDR supplies a data signal to the data lines D1 to Dm under the control of the timing controller T-CON. The data signal supplied to the data lines D1 to Dm may be supplied to pixels PX (in a unit of a horizontal line) selected by the scan signal.

The pixel area PXA may comprise pixels PX disposed in areas defined by the scan lines S1 to Sn, the initialization control lines GB1 to GBn, and the emission control lines E1 to En, which extend in a first direction (e.g., a horizontal direction), and the data lines D1 to Dm extends in a second direction (e.g., a vertical direction). Each of the pixels PX connected to one scan signal line stores a data signal from the data lines D1 to Dm to a capacitor. Subsequently, each of the pixels PX generates light with a predetermined luminance while controlling an amount of current flowing from a first power source ELVDD to a second power source ELVSS via an organic light emitting diode (not shown) corresponding to the data signal.

A signal control transistor (not shown) for controlling whether at least one of a scan signal and an emission control signal is to be transferred may be comprised at a portion between a plurality of pixels PX. The signal control transistor will be described in detail with reference to FIG. 10.

The timing controller T-CON controls the scan driver SDR, the data driver DDR, and the emission control driver EDR, corresponding to signals (not shown) supplied from the outside.

Figure 7:
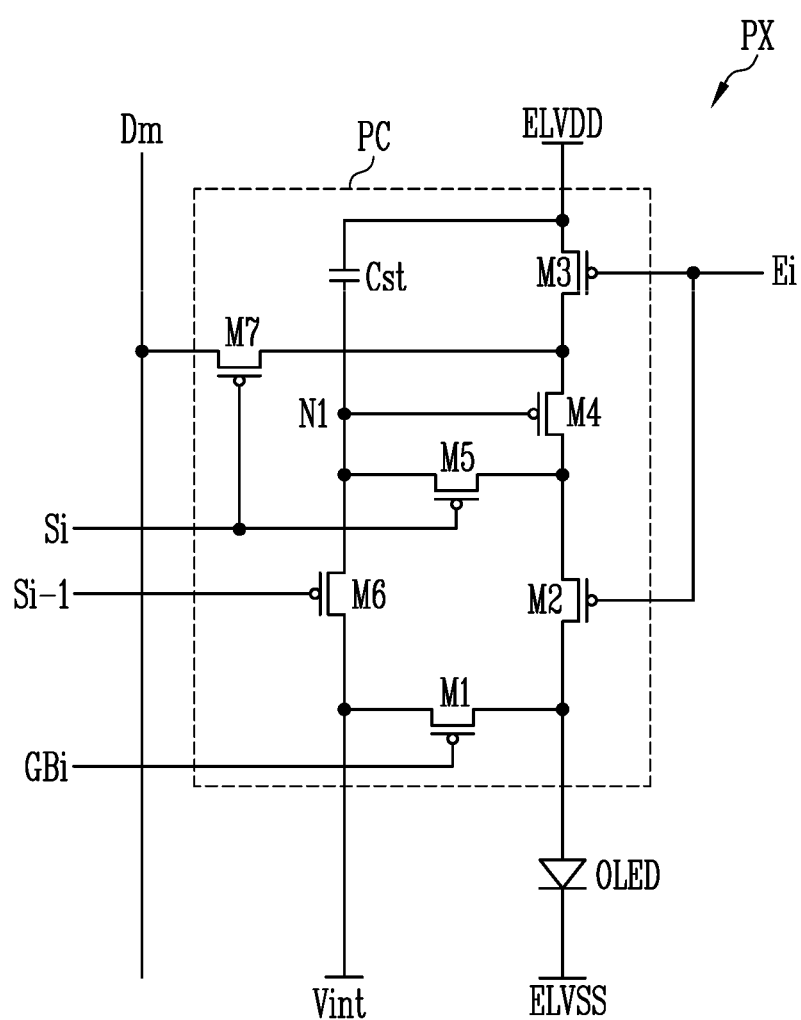
FIG. 7 is a circuit diagram illustrating an example of a pixel comprised in the display device in accordance with an embodiment of the present disclosure.

FIG. 7 is a circuit diagram illustrating an example of a pixel comprised in the display device in accordance with an embodiment of the present disclosure.

Referring to FIG. 7, the pixel PX in accordance with the embodiment of the present disclosure may comprise an organic light emitting diode OLED, first to seventh transistor M1 to M7, and a storage capacitor Cst.

An anode electrode of the organic light emitting diode OLED may be connected to a pixel circuit PC, and a cathode electrode of the organic light emitting diode OLED may be connected to the second power source ELVSS. The organic light emitting diode OLED may generate light with a predetermined luminance corresponding to an amount of current supplied from the pixel circuit PC.

The pixel circuit PC may control an amount of current flowing from the first power source ELVDD to the second power source ELVSS via the organic light emitting diode OLED corresponding to a data signal. In an example, the pixel circuit PC may initialize a gate electrode of a driving transistor M4 when a scan signal is supplied to an (i−1)th scan line Si−1, and store a data signal from an mth data line Dm when a scan signal Si is supplied to an ith scan line Si. Also, the pixel circuit PC may control an amount of current supplied to the organic light emitting diode OLED corresponding to the data signal when an emission control signal is not supplied to an ith emission control line Ei.

The pixel circuit PC may be implemented with various types of circuits currently known in the art. In addition, the first power source ELVDD may be set to a voltage higher than that of the second power source ELVSS such that a current can flow through the organic light emitting diode OLED.

The first transistor M1 may be connected between an initialization power source Vint and the anode electrode of the organic light emitting diode OLED. In addition, a gate electrode of the first transistor M1 may be connected to an ith initialization line GBi. The first transistor M1 may supply a voltage of the initialization power source Vint to the anode electrode of the organic light emitting diode OLED when an initialization signal is supplied to the ith initialization line GBi. The initialization power source Vint may be set to a voltage lower than the data signal.

Additionally, the scan driver SDR may supply an initialization signal to the ith initialization line GBi to overlap with the emission control signal supplied to the ith emission control line Ei in at least a partial period.

The second transistor M2 may be connected between the driving transistor M4 (hereinafter, a fourth transistor) and the anode electrode of the organic light emitting diode OLED. In addition, a gate electrode of the second transistor M2 may be connected to the ith emission control line Ei. The second transistor M2 may be turned off when an emission control signal is supplied to the ith emission control line Ei and be turned on in other cases.

The third transistor M3 may be connected between the first power source ELVDD and the fourth transistor M4. In addition, a gate electrode of the third transistor M3 may be connected to the ith emission control line Ei. The third transistor M3 may be turned off when an emission control signal is supplied to the ith emission control line Ei and be turned on in other cases.

A first electrode of the fourth transistor M4 may be connected to the first power source ELVDD via the third transistor M3, and a second electrode of the fourth transistor M4 may be connected to the anode electrode of the organic light emitting diode OLED via the second transistor M2. In addition, a gate electrode of the fourth transistor M4 may be connected to a first node N1. The fourth transistor M4 may control the amount of current flowing from the first power source ELVDD to the second power source ELVSS via the light emitting diode OLED corresponding to a voltage of the first node N1.

The fifth transistor M5 may be connected between the second electrode of the fourth transistor M4 and the first node N1. In addition, a gate electrode of the fifth transistor M5 may be connected to the ith scan line Si. The fifth transistor M5 may be turned on when a scan signal is supplied to the ith scan line Si to electrically connect the second electrode of the fourth transistor M4 to the first node N1. Therefore, the fourth transistor M4 may be connected in a diode form when the fifth transistor M5 is turned on.

The sixth transistor M6 may be connected between the first node N1 and the initialization power source Vint. In addition, a gate electrode of the sixth transistor M6 may be connected to the (i−1)th scan line Si−1. The sixth transistor M6 may be turned on when a scan signal is supplied to the (i−1)th scan line Si−1 to supply the voltage of the initialization power source Vint to the first node N1.

The seventh transistor M7 may be connected between the mth data line Dm and the first electrode of the fourth transistor M4. In addition, a gate electrode of the seventh transistor M7 may be connected to an ith scan line Si. The seventh transistor M7 may be turned on when a scan signal is supplied to the ith scan line Si to electrically connect the mth data line Dm to the first electrode of the fourth transistor M4.

The storage capacitor Cst may be connected between the first power source ELVDD and the first node N1. The storage capacitor Cst may store a voltage corresponding to the data signal and a threshold voltage of the fourth transistor M4.

Figure 8:
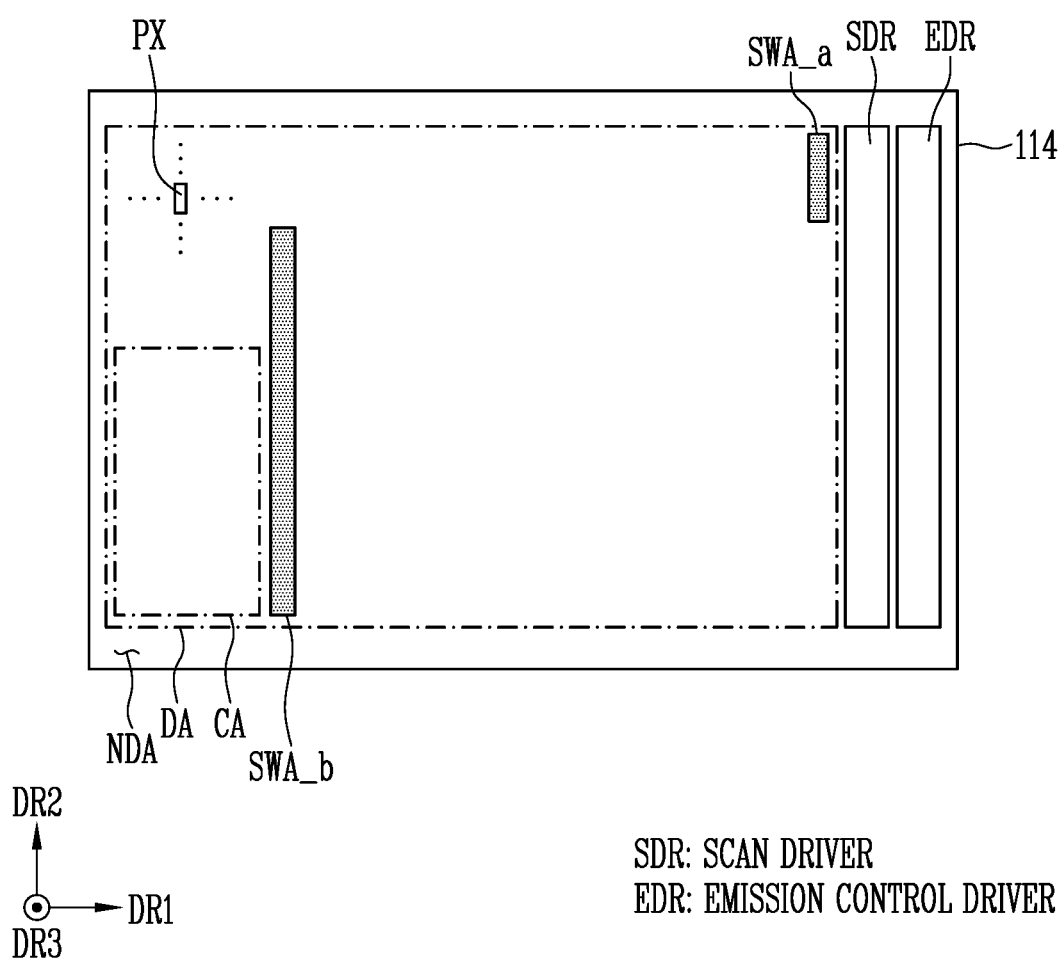
FIGS. 8 and 9 are views illustrating a driving method of a display panel in accordance with an embodiment of the present disclosure.
Figure 9:
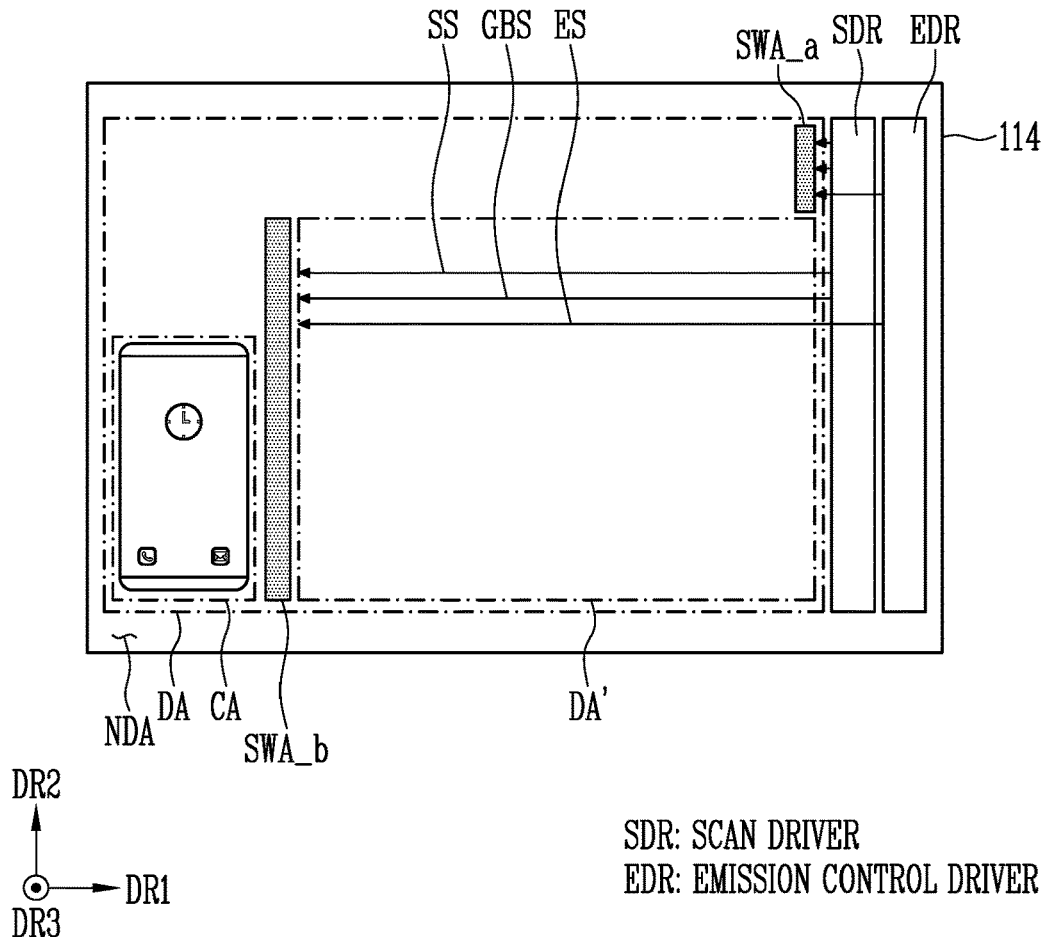
Figure 10:
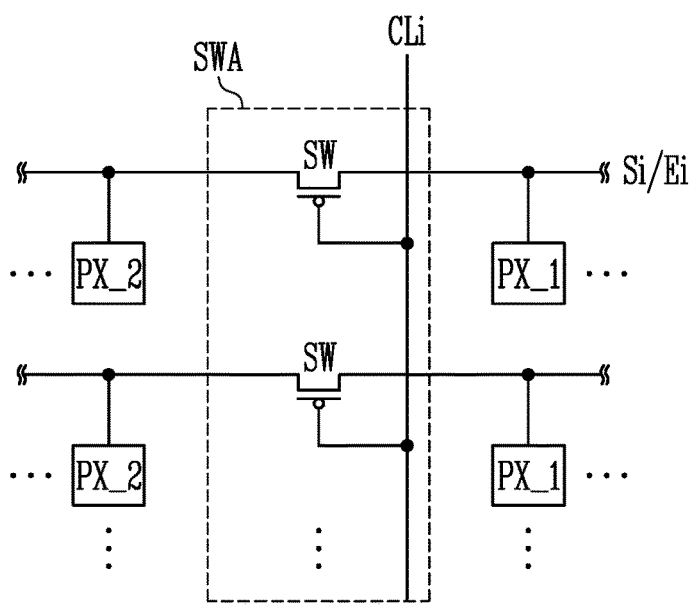
FIG. 10 is a diagram illustrating a switch circuit comprising a signal control transistor.
Figure 11:
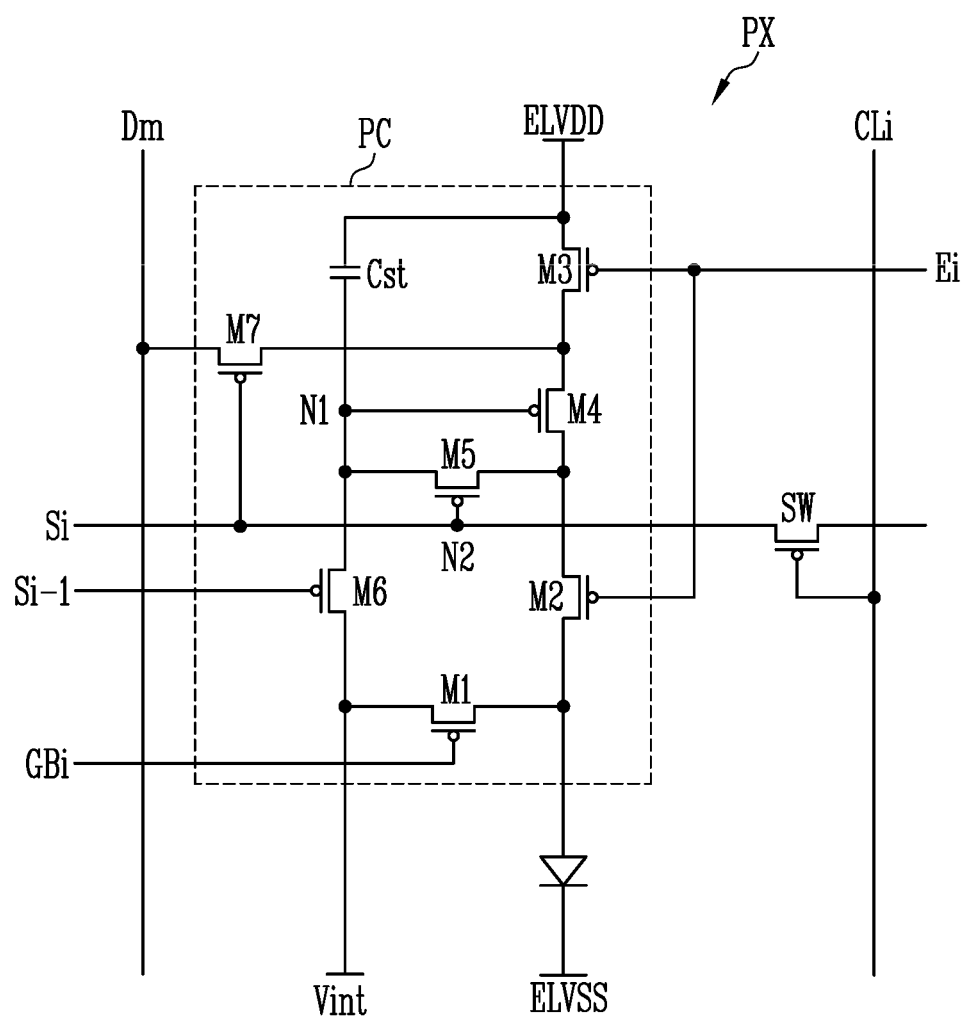
FIG. 11 is a circuit diagram illustrating an example of a pixel comprised in a display device in accordance with an embodiment of the present disclosure.

FIGS. 8 and 9 are views illustrating a driving method of the display panel in accordance with an embodiment of the present disclosure. FIG. 10 is a diagram illustrating a switch circuit comprising a signal control transistor. FIG. 11 is a circuit diagram illustrating an example of a pixel comprised in the display device in accordance with an embodiment of the present disclosure.

Referring to FIGS. 3 and 8 to 11, the display panel 114 may comprise a display area DA and a non-display area NDA.

The display area DA may comprise a charging area CA, a plurality of pixels PX, and switch circuits SWA_a and SWA_b comprising a signal control transistor SW for controlling a transmission of at least one of a scan signal and an emission control signal to pixels PX arranged on the same horizontal line. The non-display area NDA may comprise a scan driver SDR, an emission control driver EDR, and the like. For example, the scan driver SDR and the emission control driver EDR may be disposed at a right side of the non-display area NDA. The charging area CA may be disposed at a left side of the display area.

However, the position of the scan driver SDR and the emission control driver EDR may be variously changed depending on designs. For example, the scan driver SDR and the emission control driver EDR may be disposed at a left side of the non-display area NDA. The charging area CA may be disposed at a right side of the display area DA.

In accordance with an embodiment of the present disclosure, in the charger 130, the secondary coil pattern CP2 may be formed in an area overlapping with the display area DA in the thickness direction (or the third direction DR3). Meanwhile, in the panel protector 120, the magnetic field transmission part OP may be formed in an area overlapping with the display area DA in the thickness direction (or the third direction DR3). In other words, in the panel protector 120, the shielding layer 124 may be formed in an area which does not overlap with the display area DA in the thickness direction (or the third direction DR3) in the entire area of the display panel 114. For example, the panel protector 120 shown in FIGS. 5A to 5C may be applied.

However, the embodiment of the panel protector 120 and the charger 130 is not limited thereto. For example, in the charger 130, the secondary coil pattern CP2 may be formed in only an area overlapping with the charging area CA in the thickness direction (or the third direction DR3). Meanwhile, in the panel protector 120, the magnetic field transmission part OP may be formed in only an area overlapping with the charging area CA in the thickness direction (or the third direction DR3). In other words, in the panel protector 120, the shielding layer 124 may be formed in only an area which does not overlap with the charging area CA in the thickness direction (or the third direction DR3) in the entire area of the display panel 114.

In accordance with an embodiment of the present disclosure, when charging is performed through the charging area CA of the display area DA, the first display device 100 may display an image in a display area DA' (or charging mode display area) which does not comprise the charging area CA.

In accordance with an embodiment of the present disclosure, the first display device 100 may transmit a signal for sensing the second display device 200. For example, the first display device 100 may transmit a ping signal to the second display device 200 through an antenna device (not shown) electrically connected to the secondary coil pattern CP2, and sense that the second display device 200 has been placed on the charging area CA based on a detection current of the ping signal and a capacitance change.

In another embodiment, the first display device 100 may transmit a periodical searching signal to the second display device 200 through a beacon (not shown). The second display device 200 may transmit a response signal or searching signal to the first display device 100 in response to the periodical searching signal, so that the first display device 100 can sense that the second display device 200 has been placed on the charging area CA.

When the first display device 100 senses that the second display device 200 has been placed on the charging area CA, the first display device 100 may display an image in only the display area DA' (or charging mode display area) which does not comprise the charging area CA.

The charging mode display area DA' may be an area which exclude the charging area in the display area DA and has a reduced area while maintaining an aspect ratio of the display area DA. For example, when the display area DA has a length along a first direction is "b" and a length along the second direction is "a", and a length of the charging area CA along the first direction DR1 is x. A length of the charging mode display area DA' in the second direction DR2 is about b−x, a length of the charging mode display area DA' in the second direction DR2 may be about a(b−x)/b. Lengths of the switch circuits SWA_a and SWA_b may be about ax/b and about a(b-x)/b, respectively.

To this end, the switch circuits SWA_a and SWA_b may be formed in one area close to a left side of the scan driver SDR and one area close to a right side of the charging area CA. That is, as shown in FIG. 9, a first switch circuit SWA_a may be formed in the one area close to the left side of the scan driver SDR not to overlap with the charging mode display area DA' along the first direction DR1, and the second switch circuit SWA_b may be formed at a left short side of the charging mode display area DA' to completely overlapped with the charging mode display area DA'.

Referring to FIG. 10, the signal control transistor SW is disposed between a first pixel PX_1 and a pixel PX_2 connected to the same scan line Si and the same emission control line Ei. The control electrode of the signal control transistor SW is connected to an ith switch control line CLi which is disposed between the first pixel PX_1 and the pixel PX_2. The signal control transistor SW may receive a control signal provided through an ith switch control line CLi. The signal control transistor SW may control at least one of a scan signal SS, an initialization signal GBS and an emission control signal ES is to be transferred from the first pixel PX_1 to the second pixel PX_2 through the control signal.

Specifically, as shown in FIG. 11, a first electrode of the signal control transistor SW may be connected between a second node N2 connected to the gate electrode of the fifth transistor of the first pixel PX_1 and a second node N2 of the second pixel PX_2 disposed adjacent to the first pixel along a first direction DR1. In addition, a gate electrode of the signal control transistor SW may be connected to the ith switch control line CLi.

The signal control transistor SW may be turned on when a control signal is supplied to the ith switch control line CLi to electrically connect pixels PX disposed adjacent to each other. Therefore, when the signal control transistor SW is turned on, a scan signal may be applied to a plurality of pixels PX disposed on an ith horizontal line.

On the contrary, the signal control transistor SW may be turned off when the control signal is not supplied to the ith switch control line CLi to electrically disconnect the pixels PX from each other. Therefore, when the signal control transistor SW is turned off, the scan signal may not be transferred from the first pixel PX_1 to the second pixel PX_2 which are disposed adjacent to the first pixel PX_1.

For example, referring to FIGS. 9 and 10, when the scan driver SDR is disposed at a right side of the display panel 114 and when the signal control transistor SW is turned on, the scan signal may be transmitted from the right side to the left side of the display panel 114. A plurality of pixels PX disposed on the same horizontal line may receive the scan signal. Therefore, the plurality of pixels PX may be in a light emitting state. On the contrary, when the signal control transistor SW is turned off, a plurality of pixels (e.g., the second pixel PX_2) disposed at a left side with respect to the first pixel PX_1 cannot receive the scan signal. Therefore, the plurality of pixels may be in a non-light emitting state.

When the second display device 200 is placed on the charging area CA of the first display device 100 so as to perform wireless charging. Both the signal control transistors SW comprised in the first and second switch circuits SWA_a and SWA_b may be turned off. Therefore, the display area disposed at a left side with respect to the first and second switch circuits SWA_a and SWA_b may be in the non-light emitting state. That is, the display area DA may be changed to the charging mode display area DA'.

Figure 12:
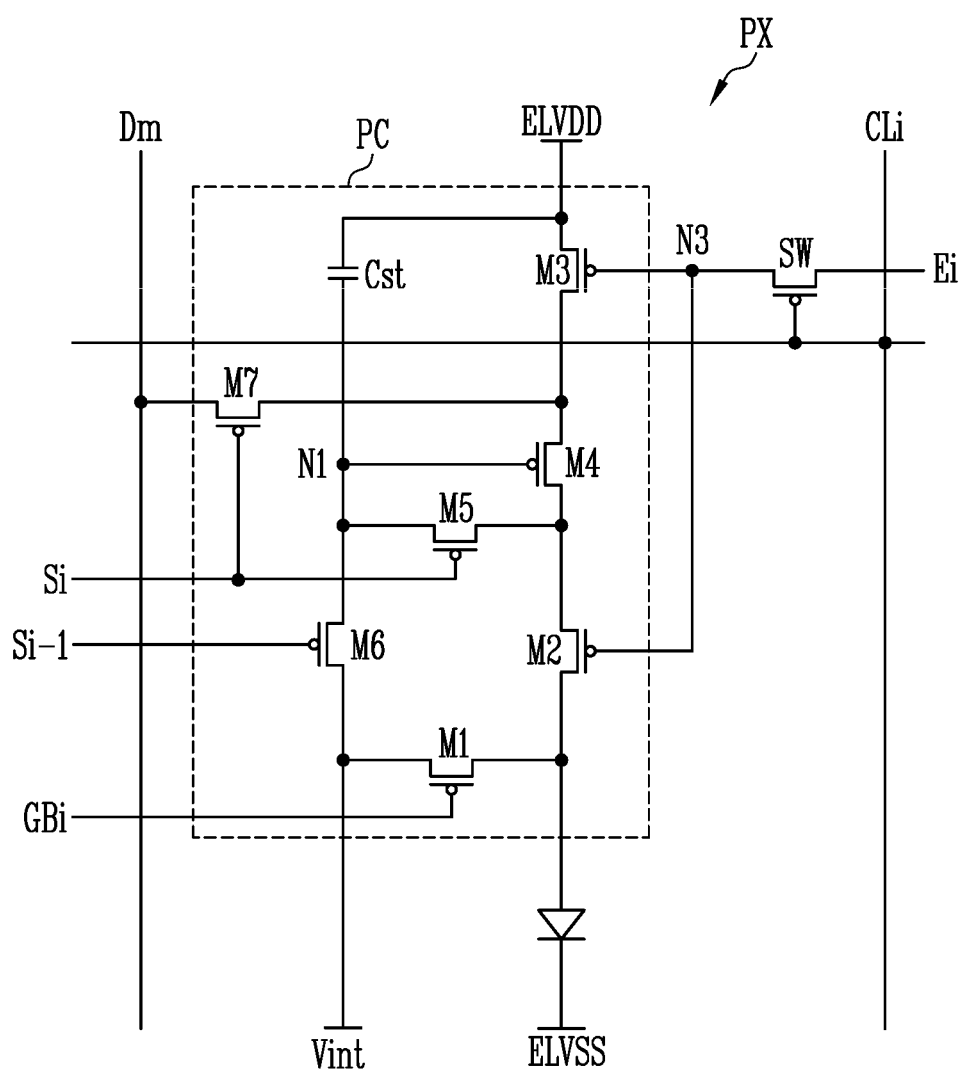
FIG. 12 is a circuit diagram illustrating an example of a pixel comprised in the display device in accordance with another embodiment of the present disclosure.

FIG. 12 is a circuit diagram illustrating an example of a pixel comprised in the display device in accordance with another embodiment of the present disclosure.

Referring to FIGS. 10 and 12, a signal control transistor SW shown in FIG. 12 is different from the signal control transistor SW shown in FIG. 11 in that the signal control transistor SW is formed in one area of the ith emission control line Ei.

Specifically, the signal control transistor SW is disposed in the ith emission control line Ei, and may be disposed in one area between a first pixel PX_1 and a second pixel PX_2 connected to the ith emission control line Ei and disposed adjacent to each other. A first electrode of the signal control transistor SW may be connected to a third node N3 which is connected to the gate electrode of the third transistor M3 of the first pixel PX_1 and a third node N3 of the second pixel PX2. In addition, a gate electrode of the signal control transistor SW may be connected to the ith switch control line CLi.

The signal control transistor SW may be turned on when a control signal is supplied to the ith switch control line CLi to supply an emission control signal to the second and third transistors M2 and M3 through the ith emission control line Ei. Therefore, the second and third transistors M2 and M3 may be turned off when the emission control signal is supplied to the ith emission control line Ei and be turned on in other cases.

On the contrary, the signal control transistor SW may be turned off when the control signal is not supplied to the ith switch control line CLi to electrically disconnect the pixels PX from each other. Therefore, the emission control signal may not be supplied to the second and third transistors M2 and M3 through the ith emission control line Ei.

For example, referring to FIGS. 9 and 10, when the emission control driver EDR is disposed at a right side of the display panel 114, the emission control signal may be transferred from the right side to the left side. When signal control transistors SW of a plurality of pixels PX disposed on the same horizontal line are turned off, a plurality of pixels (e.g., the send pixel PX_2) disposed at a left side with respect to the first pixel PX_1 cannot receive turn on signal to turn on the second and third transistors M2 and M3. Therefore, the plurality of pixels may be in the non-light emitting state.

Hereinafter, other embodiments will be described. In the following embodiments, descriptions of components identical to those of the above-described embodiment will be omitted or simplified, and portions different from those of the above-described embodiment will be mainly described.

Figure 13:
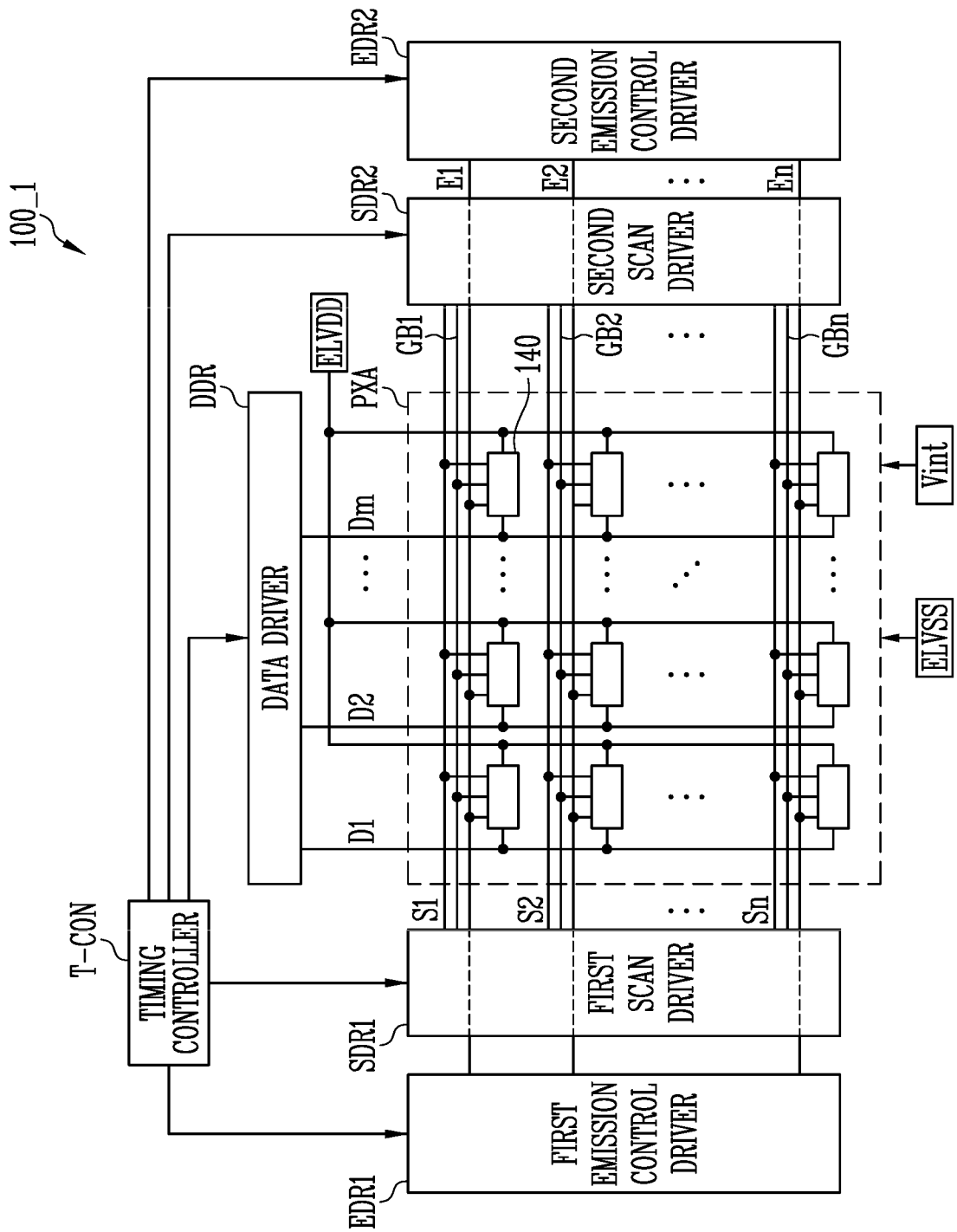
FIG. 13 is a diagram illustrating a display device in accordance with another embodiment of the present disclosure.

FIG. 13 is a diagram illustrating a display device in accordance with another embodiment of the present disclosure.

Referring to FIG. 13, a display device shown in FIG. 13 is different from the embodiment shown in FIG. 6 in that the display device further comprises a second scan driver SDR2 and a second emission control driver EDR2.

Specifically, a first display device 100_1 may comprise a first scan driver SDR1 and a first emission control driver EDR1 which are disposed at a left side of the pixel area PXA, and a second scan driver SDR2 and a second emission control driver EDR2 which are disposed at a right side of the pixel area PXA.

In accordance with an embodiment of the present disclosure, scan lines S1 to Sn and initialization lines GB1 to GBn may be disposed between the first scan driver SDR1 and the second scan driver SDR2. A first scan signal may be applied in a direction from the first scan driver SDR1 to the second scan driver SDR2 and a second scan signal may be applied in a direction from the second scan driver SDR2 to the first scan driver SDR1. That is, the first and second scan signals may be simultaneously applied to a plurality of pixels PX disposed on the same horizontal line.

Emission control lines E1 to En may be disposed between the first emission control driver EDR1 and the second emission control driver EDR2. A first emission control signal may be applied in a direction from the first emission control driver EDR1 to the second emission control driver EDR2, and a second emission control signal may be applied in a direction from the second emission control driver EDR2 to the first emission control driver EDR1. That is, the first and second emission control signals may be simultaneously applied to a plurality of pixels PX disposed on the same horizontal line.

The first and second scan drivers SDR1 and SDR2 may sequentially supply the first and second scan signals to the scan lines S1 to Sn under the control of the timing controller T-CON. The first and second scan signals may be the same signal.

Also, the first and second scan drivers SDR1 and SDR2 may sequentially supply first and second initialization control signals to the initialization control lines GB1 to GB2 under the control of the timing controller T-CON. The first and second initialization signals may be the same signal.

The first and second emission control drivers EDR1 and EDR2 may sequentially supply the first and second emission control signals to the emission control lines E1 to En under the control of the timing controller T-CON. The first and second emission control signals may be the same signal.

Figure 14:
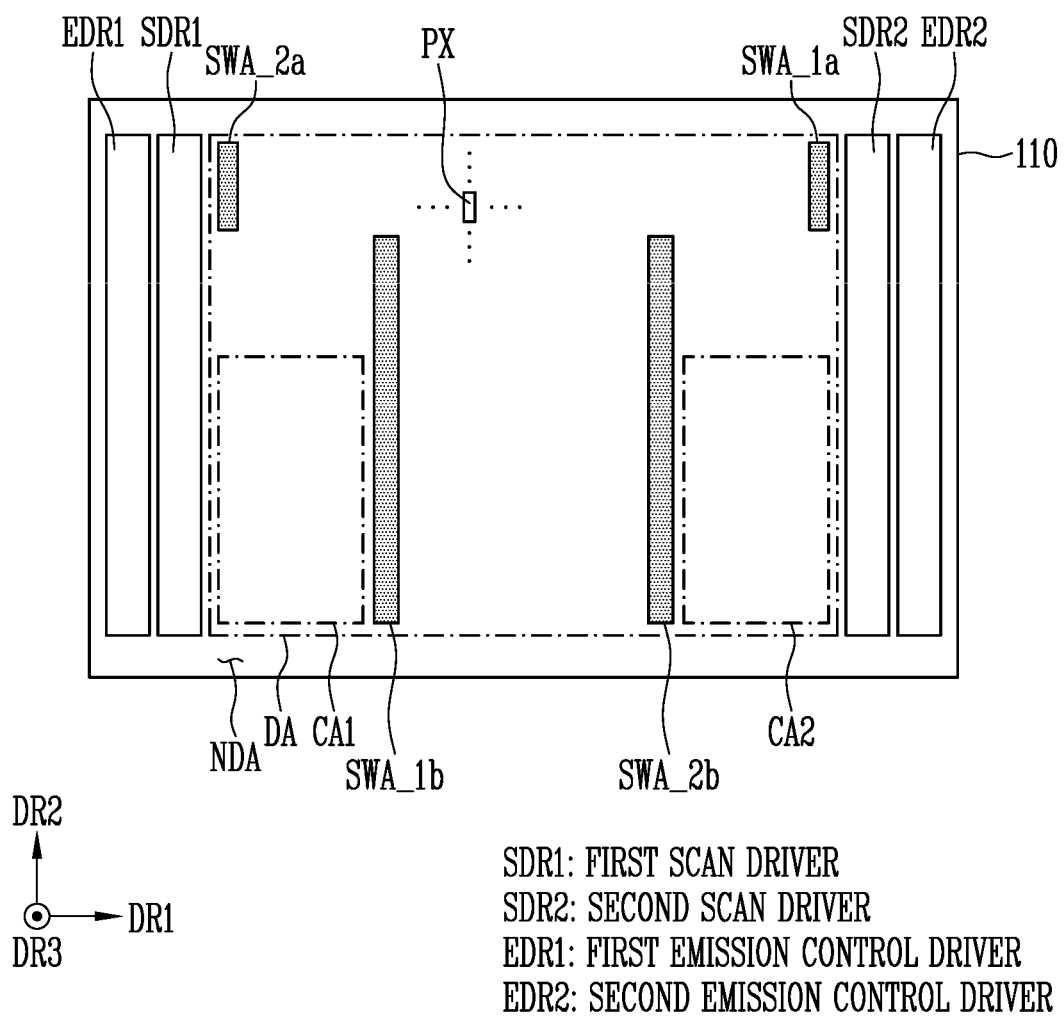
FIGS. 14, 15 and 16 are views illustrating a driving method of a display panel in accordance with another embodiment of the present disclosure.
Figure 15:
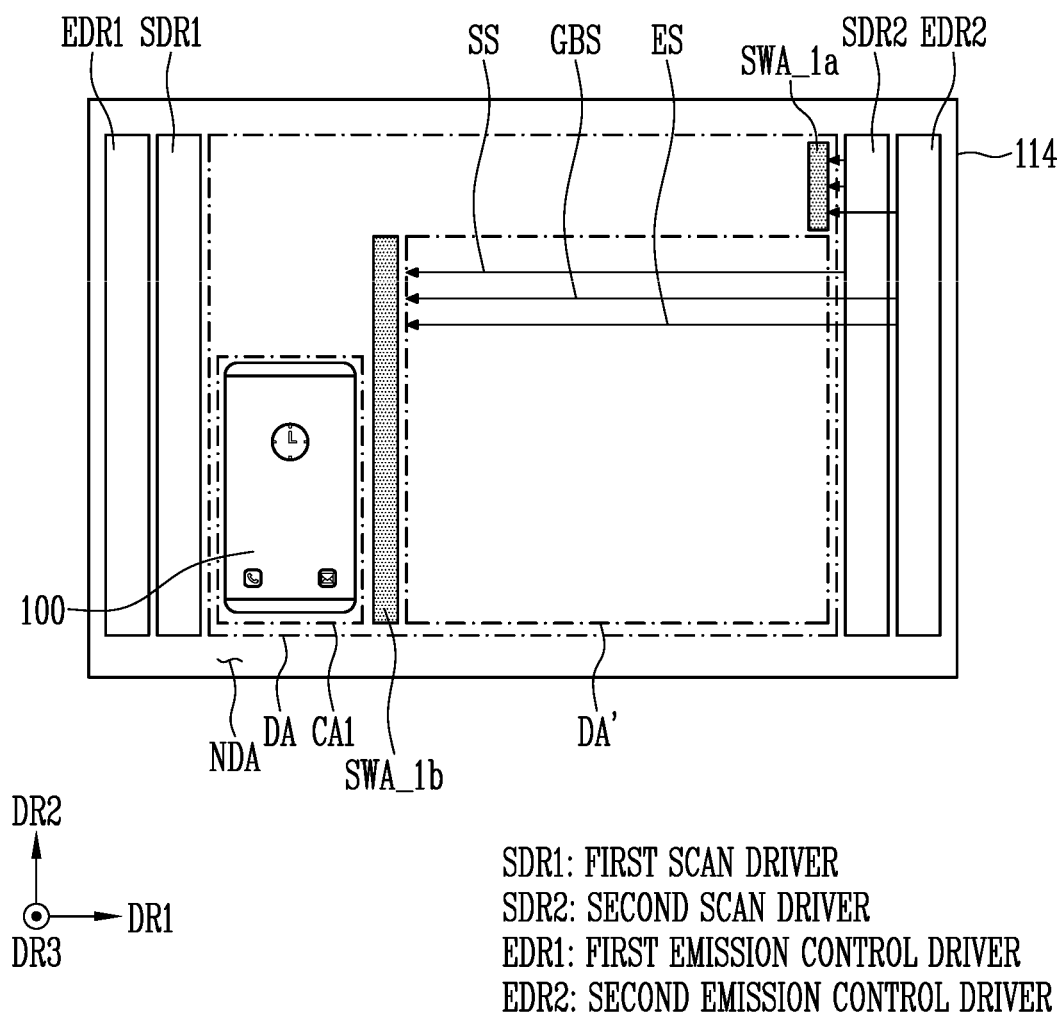
Figure 16:
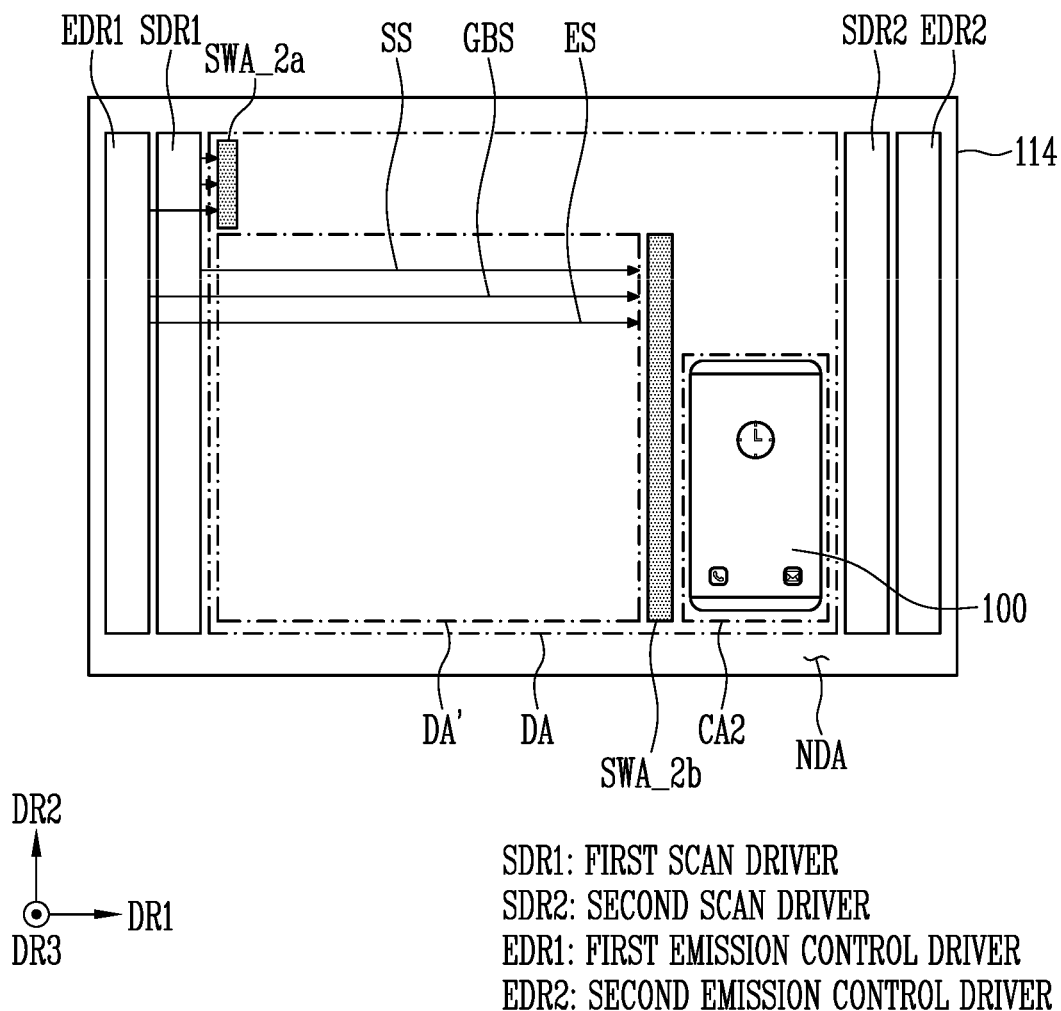

FIGS. 14 to 16 are views illustrating a driving method of a display panel in accordance with another embodiment of the present disclosure.

Referring to FIGS. 3, 7, and 10 to 16, a display panel shown in FIGS. 14 to 16 is different from the embodiment shown in FIGS. 8 and 9, in that the display panel comprises two charging areas CA1 and CA2, two pairs of switch circuits SWA_1a, SWA_1b, SWA_2a, and SWA_2b comprising a signal control transistor SW, first and second scan drivers SDR1 and SDR2, and first and second emission control drivers EDR1 and EDR2.

Specifically, the display panel 114 may comprise a display area DA and a non-display area NDA.

The display area DA may comprise charging areas CA1 and CA2, pixels PX, and switch circuits SWA_1a, SWA_1b, SWA_2a, and SWA_2b. The non-display area NDA may comprise first and second scan drivers SDR1 and SDR2, first and second emission control drivers EDR1 and EDR2, and the like. For example, the first scan driver SDR1 and the first emission control driver EDR1 may be disposed at a left side of the display area DA in the non-display area NDA. The second scan driver SDR2 and the second emission control driver EDR2 may be disposed at a right side of the display area DA in the non-display area NDA. A first charging area CA1 may be disposed at a left side of the display area DA. In addition, a second charging area CA2 may be disposed at a right side of the display area DA.

In accordance with an embodiment of the present disclosure, in the charger 130, the secondary coil pattern CP2 may be formed in an area overlapping with the display area DA in the thickness direction (or the third direction DR3). Meanwhile, in the panel protector 120, the magnetic field transmission part OP may be formed in an area overlapping with the display area DA in the thickness direction (or the third direction DR3). In other words, in the panel protector 120, the shielding layer 124 may be formed in an area which does not overlap with the display area DA in the thickness direction (or the third direction DR3) in the entire area of the display panel 114. For example, the panel protector 120 shown in FIGS. 5A to 5C may be applied to this embodiment.

However, the embodiment of the panel protector 120 and the charger 130 is not limited thereto. For example, in the charger 130, the secondary coil pattern CP2 may be formed in only an area overlapping with the first and second charging areas CA1 and CA2 in the thickness direction (or the third direction DR3). Meanwhile, in the panel protector 120, the magnetic field transmission part OP may be formed in only an area overlapping with the first and second charging areas CA1 and CA2 in the thickness direction (or the third direction DR3). In other words, in the panel protector 120, the shielding layer 124 may be formed in only an area which does not overlap with the first and second charging areas CA1 and CA2 in the thickness direction (or the third direction DR3) in the entire area of the display panel 114.

The switch circuits SWA_1a and SWA_1b may be formed in one area close to a left side of the second scan driver SDR2 and one area close to a right side of the first charging area CAL That is, as shown in FIG. 15, a first switch circuit SWA_1a may be formed in the one area close to the left side of the second scan driver SDR2 not to overlap with the charging mode display area DA' along the first direction DR1, and a second switch circuit SWA_1b may be formed at a left short side of the charging mode display area DA' to completely overlapped with the charging mode display area DA'.

Also, the switch circuits SWA_2a and SWA_2b may be formed in one area close to a right side of the first scan driver SDR1 and one area close to a left side of the second charging area CA2. That is, as shown in FIG. 16, a first switch circuit SWA_2a may be formed in the one area close to the right side of the first scan driver SDR1 not to overlap with the charging mode display area DA' along the first direction DR1, and a second switch circuit SWA_2b may be formed at a right short side of the charging mode display area DA' to completely overlapped with the charging mode display area DA'.

Hereinafter, the signal control transistor SW shown in FIG. 11 will be mainly described, but the signal control transistor SW shown in FIG. 12 may be applied to this embodiment.

Referring to FIG. 15, when the second display device 200 is placed on the first charging area CA1 of the first display device 100 so as to perform wireless charging, the first scan driver SDR1 and the first emission control driver EDR1 may be turned off. On the contrary, the second scan driver SDR2 and the second emission control driver EDR2 may be turned on. Therefore, driving signals SS, GBS, and ES are not applied from the first scan driver SDR1 and the first emission control driver EDR1, and may be applied from the second scan driver SDR2 and the second emission control driver EDR2.

Meanwhile, signal control transistors SW comprised in the switch circuits SWA_1a and SWA_1b may all be turned off. Therefore, the display device DA disposed at a left side with respect to the switch circuits SWA_1a and SWA_1b may be in the non-light emission state. For example, the second scan signal SS and the second initialization signal GBS may be transferred toward the first scan driver SDR1 from the second scan driver SDR2. When the signal control transistors SW of the first and second switch circuits SWA_1a and SWA_1b are turned off, a plurality of pixels PX disposed at a left side with respect to the first and second switch circuits SWA_1a and SWA_1b cannot receive any scan signal. Therefore, the plurality of pixels PX may be in the non-light emitting state. That is, the display area DA may be changed to the charging mode display area DA'.

In accordance with an embodiment of the present disclosure, the charging mode display area DA' may be an area which exclude the charging area in the display area DA and has a an area which exclude the charging area in the display area DA and has a reduced area while maintaining an aspect ratio of the display area DA. For example, when the display area DA has a length along a first direction is "b" and a length along the second direction is "a", and a length of the charging area CA along the first direction DR1 is x. Since a length of the charging mode display area DA' in the second direction DR2 is about b–x, a length of the charging mode display area DA' in the second direction DR2 may be about a(b–x)/b. Lengths of the switch circuits SWA_1a and SWA_1b may be about ax/b and about a(b–x)/b, respectively.

Unlike the embodiment shown in FIG. 15, FIG. 16 illustrates a case where the second display device 200 is place in the second charging area CA2 of the first display device 100. FIG. 16 is the opposite embodiment of the embodiment shown in FIG. 15, and hence detailed descriptions will be omitted.

FIG. 17 is a view illustrating a driving method of a display panel in accordance with another embodiment of the present disclosure.

Referring to FIGS. 3, 7, 10 to 13, and 17, the display panel in accordance with this embodiment is different from the embodiment shown in FIGS. 14 to 16, in that a charging area CA is not fixed, but may be set at an arbitrary position of the display area DA and that a signal control transistor SW is comprised between each of adjacent pixels PX disposed along the first direction (a row direction).

Specifically, the display area DA may comprise a movable charging area CA and a signal control transistor SW. The non-display area NDA may comprise first and second scan drivers DR1 and DR2, first and second emission control drivers EDR1 and EDR2, and the like. For example, the first scan driver SDR1 and the first emission control driver EDR1 may be disposed at a left side of the display area DA in the non-display area NDA. The second scan driver SDR2 and the second emission control driver EDR2 may be disposed at a right side of the display area DA in the non-display area NDA.

In accordance with an embodiment of the present disclosure, in the charger 130, the secondary coil pattern CP2 may be formed in an area overlapping with the display area DA in the thickness direction (or the third direction DR3). Meanwhile, in the panel protector 120, the magnetic field transmission part OP may be formed in an area overlapping with the display area DA in the thickness direction (or the third direction DR3). In other words, in the panel protector 120, the shielding layer 124 may be formed in an area which does not overlap with the display area DA in the thickness direction (or the third direction DR3) in the entire area of the display panel 114. For example, the panel protector 120 shown in FIGS. 5A to 5C may be applied to this embodiment.

Hereinafter, the signal control transistor SW will be described using the example as shown in FIG. 11, but the signal control transistor SW shown in FIG. 12 may be applied to this embodiment.

When the second display device 200 is placed at an arbitrary position of the display area DA of the first display device 100 so as to perform wireless charging, the first display device 100 may set, as the charging area CA, an area corresponding to the position at which the second display device 200 is placed. The charging area CA may be set based on a change in sensing value of the secondary coil pattern CP2 as the second display device 200 is disposed. When the charging area CA is set, a signal control transistor SW corresponding to the position of the charging area CA may be turned off.

In accordance with an embodiment of the present disclosure, the first display device 100 may transmit a signal for sensing the second display device 200. For example, the first display device 100 may transmit a ping signal to the second display device 200 through an antenna device (not shown) electrically connected to the secondary coil pattern CP2, and sense that the second display device 200 is placed on the charging area CA of the first display device 100 based on a detection current of the ping signal and a capacitance change.

Specifically, when the first display device 100 senses that the second display device 200 is placed at an arbitrary position of the display area DA of the first display device 100 so as to perform wireless charging, the first and second scan drivers SDR1 and SDR2 and the first and second emission control drivers EDR1 and EDR2 may all be turned on. Therefore, driving signals SS, GBS, and ES may be applied in a direction from the first scan driver SDR1 and the first emission control driver EDR1 to the second scan driver SDR2 and the second emission control driver EDR2, and be applied in a direction from the second scan driver SDR2 and the second emission control driver EDR2 to the first scan driver SDR1 and the first emission control driver EDR1.

Also, the first display device 100 may measure a change in sensing value of the secondary coil pattern CP2. When wireless charging between the first and second display devices 100 and 200 is performed, the first display device 100 may set, as the charging area CA, a position at which the sensing value of the secondary coil pattern CP2 is changed. In other words, the display area DA of the first display device 100, which corresponds to the position at which the second display device 200 is placed, may be set as the charging area CA.

Signal control transistors SW disposed adjacent to left and right sides of the charging area CA in which the second display device 200 is placed may be turned off. Therefore, the charging area CA may be in the non-light emitting state, and the display area DA except the charging area CA may be in the light emitting state.

However, the method in which the first display device 100 sets the charging area CA is not limited thereto. For example, the first display device 100 may detect a position at which the second display device 200 is placed through an Electro-Magnetic Radiation (EMR) circuit, etc., and set the detected position as the charging area CA.

Figure 18:
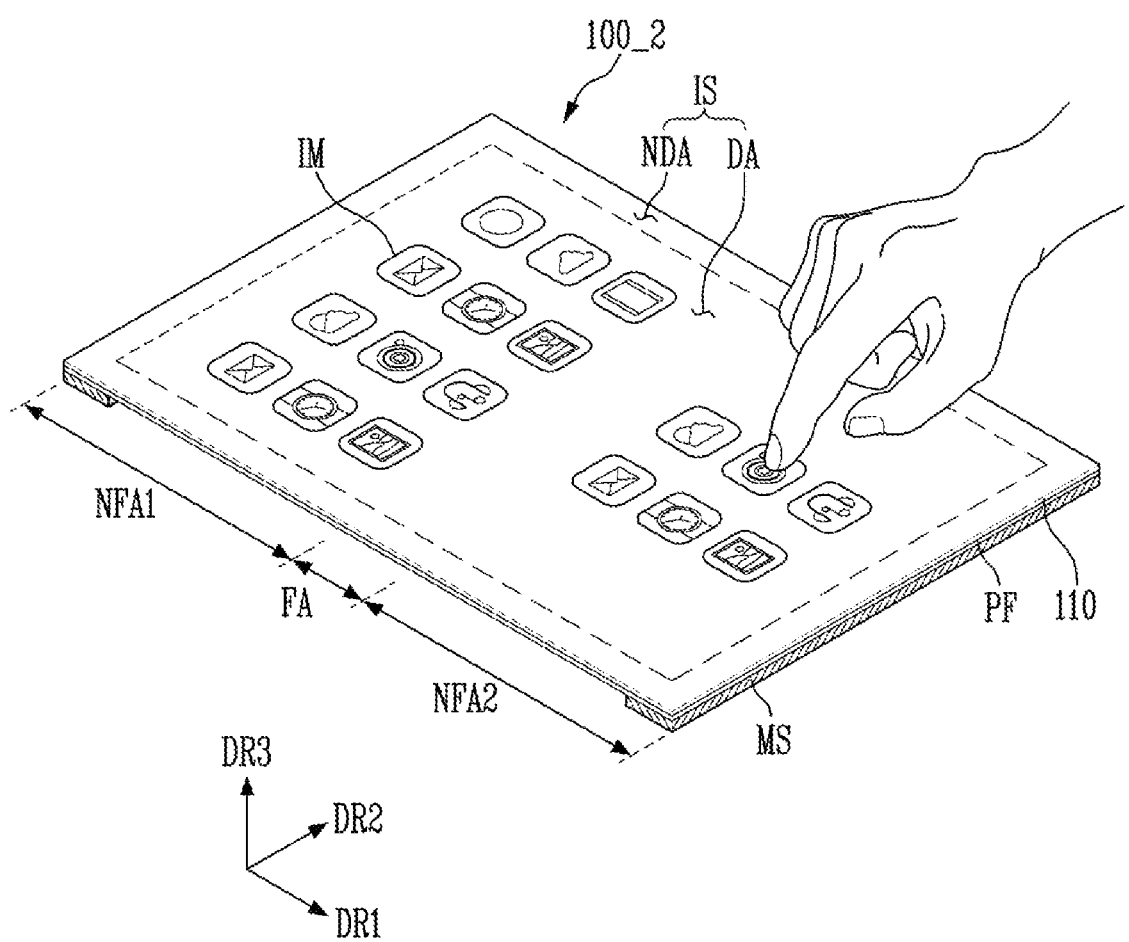
FIG. 18 is a perspective view illustrating a display device in accordance with another embodiment of the present disclosure.
Figure 19:
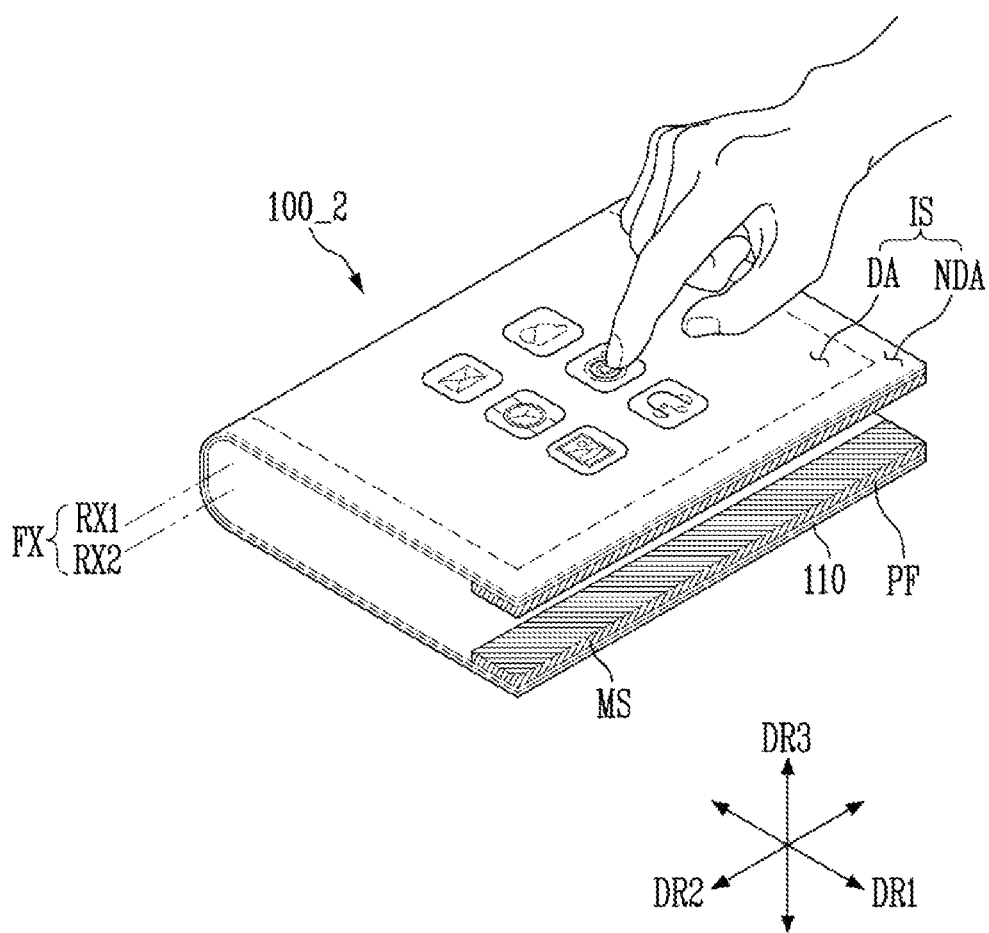
FIG. 19 is a view illustrating a state in which the display device shown in FIG. 18 is out-folded.
Figure 20A:
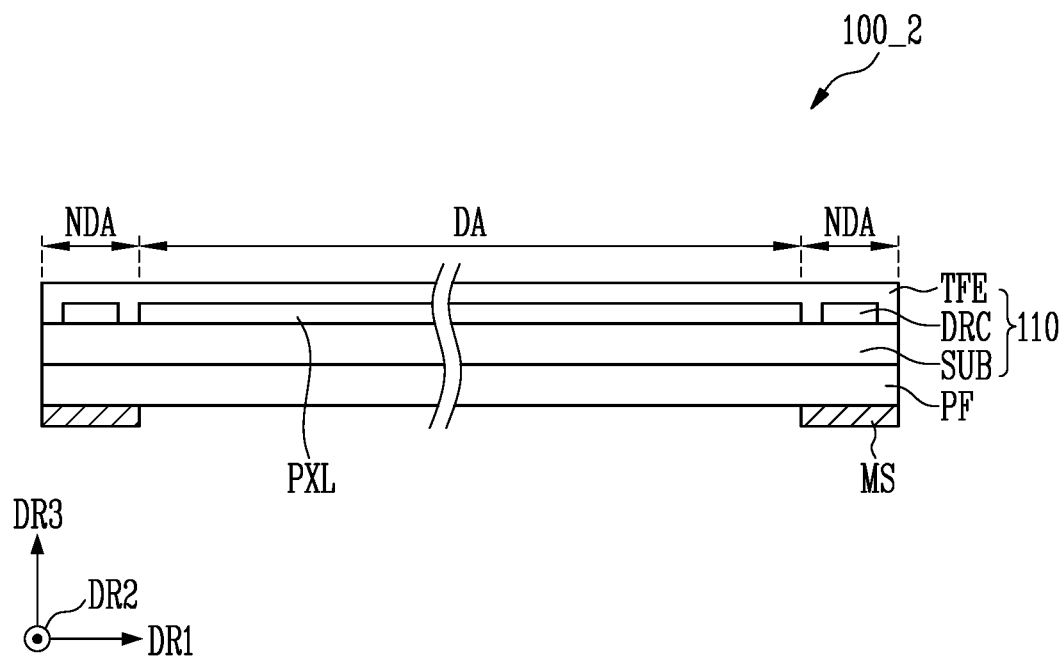
FIGS. 20A and 20B are views illustrating a sectional configuration of the display device shown in FIG. 18.
Figure 20B:
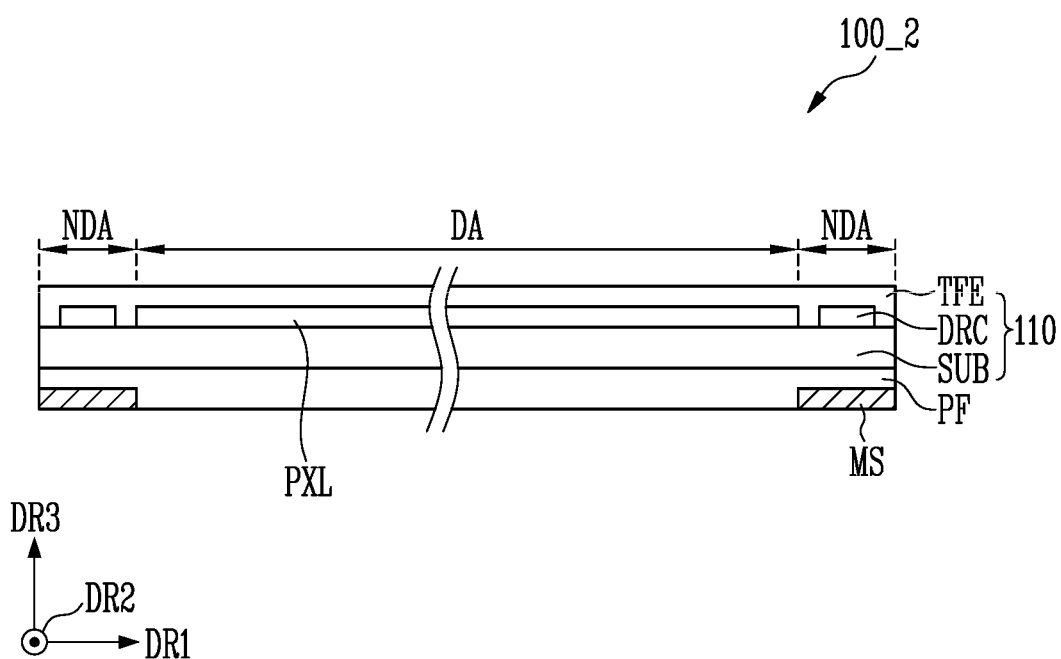

FIG. 18 is a perspective view illustrating a display device in accordance with another embodiment of the present disclosure. FIG. 19 is a view illustrating a state in which the display device shown in FIG. 18 is out-folded. FIGS. 20A and 20B are views illustrating a sectional configuration of the display device shown in FIG. 18.

Referring to FIGS. 18 to 20, a first display device 100_2 is different from the embodiment shown in FIG. 1, in that the first display device 100_2 is foldable.

Specifically, the first display device 100_2 in accordance with the embodiment of the present disclosure may have a rectangular shape having long sides in a first direction DR1 and short sides in a second direction DR2 intersecting the first direction DR1. However, the present disclosure is not limited thereto, and the first display device 100_2 may have various shapes. The first display device may be a flexible first display device 100_2, and be a first display device folded or unfolded with respect to a folding axis FX extending in the second direction DR2.

The first display device 100_2 may include a plurality of areas according to folding thereof. For example, the first display device 100_2 may include a folding area FA disposed between two non-folding areas NFA1 and NFA2. In this embodiment, one folding area FA is included in the first display device 100_2. However, the present disclosure is not limited thereto, and a plurality of folding areas may be included in the first display device 100_2.

In accordance with an embodiment of the present disclosure, the folding axis FX my comprise a first rotation axis RX1 and a second rotation axis RX2, which extend in the second direction DR2 and are disposed to be adjacent to each other so as to provide biaxial rotation axes to the first display device 100_2. The folding area FA may overlap with the first and second rotational axes RX1 and RX2, and the first display device 100_2 may be folded with respect to the first rotation axis RX1 and the second rotation axis RX2.

The first display device 100_2 may comprise a display screen 110 and a protective film PF. A top surface of the display screen 110 may be defined as a display surface IS and be a plane parallel to the first direction DR1 and the second direction DR2. Images IM generated in the display screen 110 may be provided to a user through the display surface IS.

The display surface IS comprises a display area DA and a non-display area NDA at the periphery of the display area DA. The display area DA displays an image, and the non-display area NDA may not display the image.

The display screen 110 may comprise a base layer SUB, a pixel layer PXL disposed on the base layer SUB, IC elements DRC which are disposed on the base layer SUB and apply a driving signal to the pixel layer PXL, and an encapsulation layer TFE disposed on the base layer SUB to cover the pixel layer PXL and the IC elements DRC. Although not shown in the drawings, a charger (see FIG. 3) charged by wireless through a wireless power transmitter may be disposed on the bottom of the display screen 110.

The base layer SUB may form a rear surface of the first display device 100_2 and have flexibility. The pixel layer PXL may comprise a plurality of pixels (not shown), and be driven by receiving a plurality of driving signal applied from the IC elements DRC, to generate images IM. The encapsulation layer TFE may protect the pixel layer PXL and the protective film PF may be provided on the bottom of the display screen 110.

The protective film PF may protect the display screen 110 from external impact. The protective film PF may be employed without limit as long as it is a general one known in the art. For example, the protective film PF may be a polyimide film. For example, the protective film PF may be a flexible film. The protective film PF may be formed in a multi-layer, and comprise an organic insulating layer or an inorganic insulating layer.

A magnetic field shielding layer MS may be disposed on the bottom of the protective film PF as shown in FIG. 20A. The magnetic field shielding layer MS may protect the IC elements DRC from a magnetic field. The magnetic field shielding layer MS may be disposed to overlap with the non-display area in which the IC elements DRC are disposed in a thickness direction (or a third direction DR3). The magnetic field shielding layer MS may shield an electromagnetic wave and comprise a material such as copper, nickel, ferrite or silver, which has excellent thermal conductivity.

Meanwhile, the magnetic field shielding layer MS may be disposed in the protective film PF as shown in FIG. 20B. For example, the magnetic field shielding layer MS may be formed by forming a groove in an area overlapping with the non-display area NDA in which the IC elements DRC are disposed in the thickness direction (or the third direction DR3) and printing the magnetic field shielding layer MS in the groove.

Figure 21:
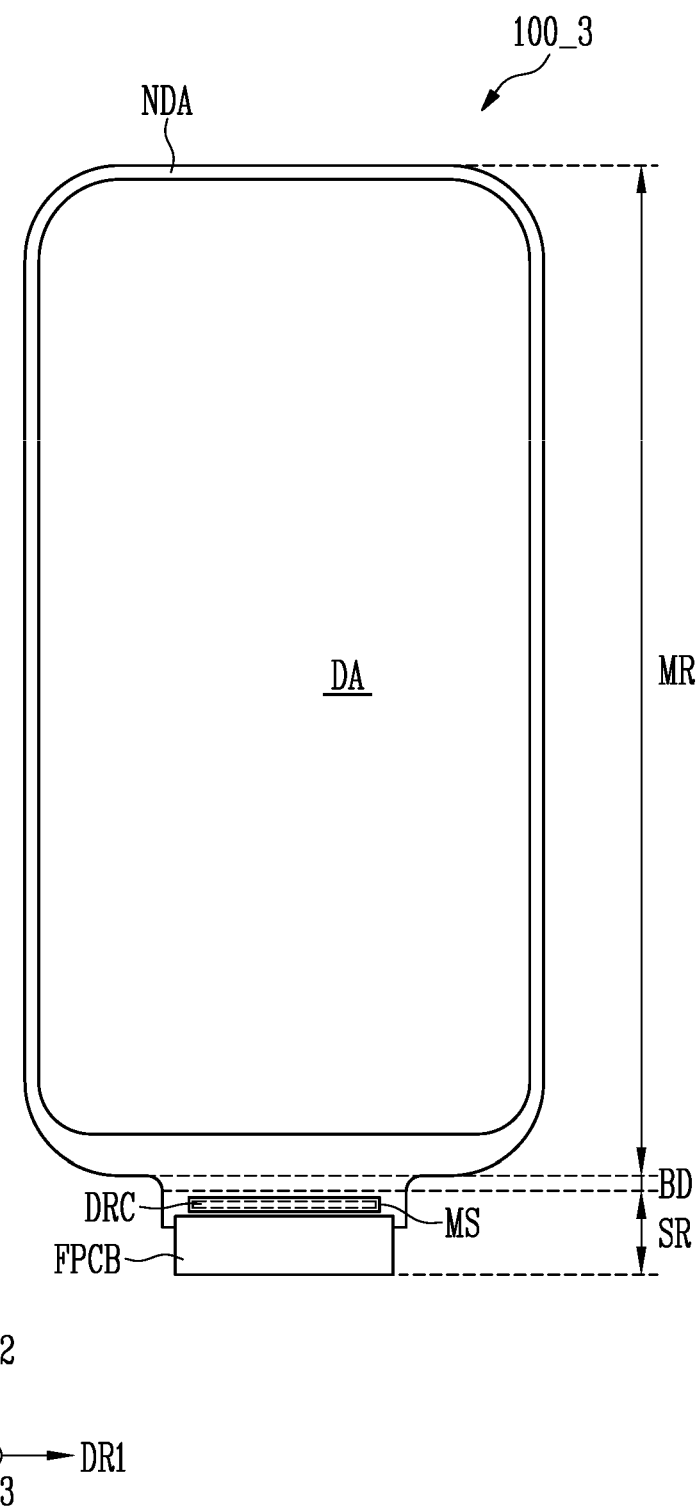
FIG. 21 is a plan view of a display device in accordance with another embodiment of the present disclosure.
Figure 22A:
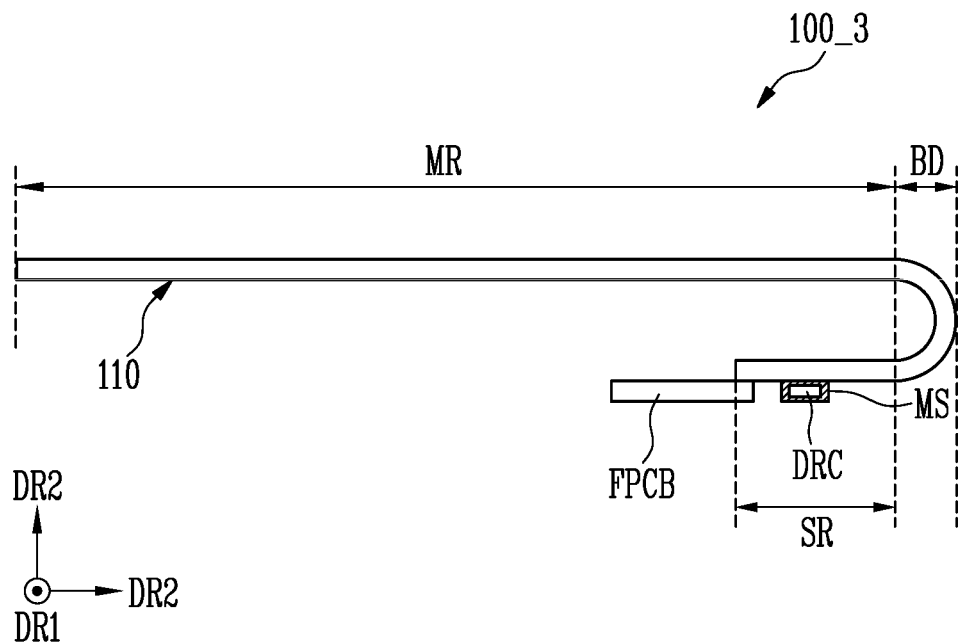
FIGS. 22A and 22B are sectional views illustrating a sectional configuration of the display device shown in FIG. 21.
Figure 22B:
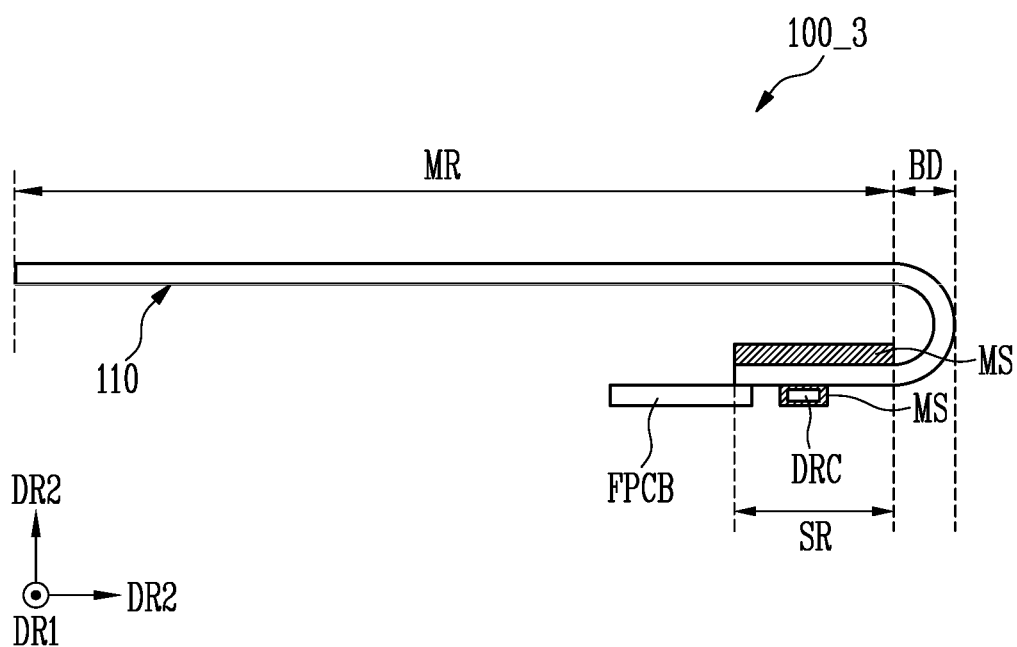

FIG. 21 is a plan view of a display device in accordance with another embodiment of the present disclosure. FIGS. 22A and 22B are sectional views illustrating a sectional configuration of the display device shown in FIG. 21.

Referring to FIGS. 21, 22A, and 22B, a first display device 100_3 is different from the embodiment shown in FIG. 1, in that the first display device 100_3 comprises a bent area BD.

Specifically, the first display device 100_3 may be curvable, bendable, foldable or rollable. The first display device 100_3 may comprise a main area MR and a bent area BD connected to one side of the main area MR. The first display device 100_3 may further comprise a sub-area SR which is connected to the bent area BD and overlaps with the main area MR in a thickness direction.

When a portion which displays an image in the first display device 100_3 is defined as a display area DA and a portion which does not display the image in the first display device 100_3 is defined as a non-display area NDA, The display area DA of the first display device 100_3 is disposed in the main area MR. The other portion except the display area DA becomes the non-display area NDA of the first display device 100_3. In an embodiment, a peripheral edge portion of the display area DA in the main area MR, the whole of the bent area BD, and the whole of the sub-area SR may correspond to the non-display area NDA. However, the present disclosure is not limited thereto, and the bent area BD and/or the sub-area SR may also comprise the display area DA.

The main area MR may roughly have a shape similar to the appearance of the first display device 100_3 in a plan view. The main area MR may be a flat area disposed on one plane. However, the present disclosure is not limited thereto, and at least one edge among the other edges except an edge (side) connected to the bent area BD in the main area MR may be curved to be curved or bent in a vertical direction.

When at least one edge among the other edges except the edge (side) connected to the bent area BD in the main area MR is curved or bent, the display area DA may also be disposed at the corresponding edge. However, the present disclosure is not limited thereto. For example, the non-display area NDA which does not display the screen may be disposed at the curved or bent edge, or the display area DA and the non-display area NDA may be disposed together at the curved or bent edge.

The non-display area NDA may be disposed at the periphery of the display area DA in the main area MR. The non-display area NDA of the main area MR may be placed in an area from an outer boundary of the display area DA to an edge of the display device 100_3. A signal line for applying a signal to the display area DA or driving circuits may be disposed in the non-display area NDA of the main area MR. In addition, an outermost black matrix may be disposed in the non-display area NDA of the main area MR, but the present disclosure is not limited thereto.

The bent area BD is connected to the main area MR. For example, the bent area BD may be connected to the main area MR through one short side of the main area MR. A width of the bent area BD may be smaller than a width of the main area MR (a width of the short side).

The first display device 100_3 in the bent area BD may be bent with a curvature in a lower direction of the thickness direction, i.e., in the opposite direction of a display surface. The bent area BD may have a constant radius of curvature. However, the present disclosure is not limited thereto, and the radius of curvature of the bent area BD may be changed for each section. Since the first display device 100_3 is bent in the bent area BD, a surface of the first display device 100_3 is reversed. That is, one surface of the first display device 100_3, which face upward, may be changed to face outward and then face downward through the bent area BD.

The sub-area SR extends from the bent area BD. The sub-area SR may extend in a direction parallel to the main area MR. The sub-area SR may overlap with the main area MR in the thickness direction of the first display device 100_3. The sub-area SR may overlap with the non-display area NDA at an edge of the main area MR, and further overlap with the display area DA of the main area MR.

IC elements DRC may be disposed on the sub-area SR of the first display device 100_3. The IC elements DRC may comprise an integrated circuit which drives the first display device 100_3. The IC elements DRC may be mounted on the first display device 100_3 in the sub-area SR. The IC elements DRC are mounted on one surface of the first display device 100_3 which is the same surface as the display surface. The IC elements DRC may be mounted on the surface of the first display device 100_3 which faces downward in the thickness direction as the bent area BD is bent so that the top of the IC elements DRC faces downward.

The IC elements DRC may be attached onto the first display device 100_3 through an anisotropic conductive film or be attached onto the first display device 100_3 through ultrasonic bonding.

A display driving board FPCB may be connected to an end portion of the sub-area SR of the first display device 100_3. The display driving board FPCB may be a flexible printed circuit board or a film.

Although not shown in the drawings, a charger (see FIG. 3) capable of performing wireless charging through a wireless power transmitter may be comprised between the main area MR and the sub-area SR. For example, at least a portion of the charger may be disposed to overlap with the IC elements DRC in the thickness direction (or the third direction DR3).

A magnetic field shielding layer MS may be formed to surround the outer surface of the IC elements DRC as shown in FIG. 21A. For example, when the IC elements DRC have a rectangular parallelepiped shape, the magnetic field shielding layer MS may be coated on top, bottom, and side surfaces. The magnetic field shielding layer MS may comprise a material such as copper, nickel, ferrite or silver, which shields an electromagnetic wave and has excellent thermal conductivity.

Meanwhile, the magnetic field shielding layer MS may be additionally formed on the sub-area SR as shown in FIG. 21B.

In the display device in accordance with the present disclosure, a magnetic field exchange process between a primary coil and a secondary coil can be smoothly performed without being interfered by a shielding sheet in wireless charging.

Further, in accordance with the present disclosure, the display device can protect a circuit of the display panel, a driving signal of the display panel, and the like from Electro-Magnetic Interference (EMI) which may be generated in the magnetic field exchange process between the primary coil and the secondary coil.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
   a display screen comprising a display surface that includes a display area and a non-display area;
   a charger disposed under the bottom surface of the display screen, the charger performing charging by using a magnetic field; and
   a panel protector disposed between the display screen and the charger, the panel protector comprising a magnetic field transmission part that overlaps with the display area in a plan view,
   wherein the display screen comprises a switch circuit which interrupts a signal applied to a charging area in the display area such that an image is not displayed in the charging area when charging is performed through the charging area.

2. The display device of claim 1, wherein the display screen comprises:
   a first scan driver disposed on one side of the non-display area, the first scan driver supplying scan signals to a plurality of scan lines and supplying initialization control signals to a plurality of initialization control lines; and
   a first emission control driver disposed on the one side of the non-display area, the first emission control driver supplying emission control signals to a plurality of emission control lines.

3. The display device of claim 2, wherein the charging area comprises a first charging area disposed on the display area adjacent to the other side of the non-display area that opposes the one sided of the non-display area.

4. The display device of claim 3, wherein the switch circuit comprises a first switch circuit disposed adjacent to the one side of the non-display area.

5. The display device of claim 4, wherein the first switch circuit comprises a plurality of signal control transistors for controlling transmission of at least one of the scan signals and the emission control signals to a plurality of scan lines connected to the first switch circuit.

6. The display device of claim 5, wherein the display screen further comprises a plurality of pixels disposed in the display area,
   wherein each of the pixels comprises:
   a driving transistor;
   at least one emission control transistor; and
   at least one switch transistor.

7. The display device of claim 6, wherein each of the signal control transistors is disposed between a first pixel and a second pixel which are disposed adjacent to each other among the plurality of pixels, and is connected to a scan line for supplying a gate signal to each switch transistor of the first pixel and the second pixel.

8. The display device of claim 6, wherein each of the signal control transistors is disposed between a first pixel and a second pixel which are disposed adjacent to each other among the plurality of pixels, and is connected to an emission control line for supplying a gate signal to at least one emission control transistor of each of the first pixel and the second pixel.

9. The display device of claim 4, wherein the display screen further comprises a second scan driver and a second emission control driver disposed on the other side of the non-display area.

10. The display device of claim 9, wherein the charging area comprises a second charging area disposed on the display area adjacent to the one side of the non-display area.

11. The display device of claim 10, wherein the second scan driver and the second emission control driver are turned off when charging is performed through the first charging area, and the first scan driver and the first emission control driver are turned off when charging is performed through the second charging area.

12. The display device of claim 10, wherein, when charging is performed through the second charging area, the display screen displays an image in a second charging mode display area which does not comprise the second charging area in the display area,
   wherein the switch circuit further comprises a second switch circuit disposed adjacent to the other side of the non-display area.

13. The display device of claim 12, wherein each of the first switch circuit and the second switch circuit comprise a plurality of signal control transistors for controlling transmission of at least one signal among the scan signals and the emission control signals to a plurality of scan lines connected to the first switch circuit and the second switch circuit.

14. The display device of claim 1, wherein the panel protector comprises a shielding layer disposed in an area overlapping with the non-display area in a plan view.

15. The display device of claim 14, wherein the shielding layer comprises at least one of copper, nickel, ferrite, and silver which shields an electromagnetic wave.

16. The display device of claim 14, wherein the panel protector further comprises:
   a light absorbing layer disposed under the display screen, the light absorbing layer blocking light emitted from the display screen from being leaked through the bottom of the display screen;
   a shock absorbing layer disposed under the light absorbing layer, the shock absorbing layer absorbing external impact; and
   a heat dissipation layer disposed under the shock absorbing layer, the heat dissipation layer dissipating heat generated from the display screen,
   wherein the shielding layer is disposed under the heat dissipation layer.

17. The display device of claim 14, wherein the charger comprises at least one coil pattern overlapping with the magnetic field transmission part,
   wherein the charger supplies power to an external device such as another display device through the display surface, or is supplied with power from a wireless power transmitter to charge a battery.

18. The display device of claim 17, wherein the charger comprises the coil pattern in an area overlapping with the charging area in a plan view.

19. The display device of claim 17, wherein the panel protector comprises the shielding layer in an area which does not overlap with the charging area in a plan view.

20. The display device of claim 1, wherein the shielding layer comprises a plurality of openings having a circular shape.

* * * * *